United States Patent
Nalukurthy et al.

(10) Patent No.: US 12,087,150 B2
(45) Date of Patent: *Sep. 10, 2024

(54) SYSTEMS AND METHODS FOR COMMISSIONING A SECURITY SYSTEM

(71) Applicant: Honeywell International Inc., Charlotte, NC (US)

(72) Inventors: RajeshBabu Nalukurthy, Bangalore (IN); Narendra Chandrakant Salve, Bangalore (IN); Srivatsa Haridas, Bangalore (IN)

(73) Assignee: Honeywell International Inc., Charlotte, NC (US)

( * ) Notice: Subject to any disclaimer, the term of this patent is extended or adjusted under 35 U.S.C. 154(b) by 128 days.

This patent is subject to a terminal disclaimer.

(21) Appl. No.: 17/511,069

(22) Filed: Oct. 26, 2021

(65) Prior Publication Data
US 2022/0108601 A1 Apr. 7, 2022

Related U.S. Application Data

(63) Continuation of application No. 16/941,296, filed on Jul. 28, 2020, now Pat. No. 11,158,184, which is a
(Continued)

(51) Int. Cl.
*G08B 29/18* (2006.01)
*G06F 3/0482* (2013.01)
(Continued)

(52) U.S. Cl.
CPC ......... *G08B 29/185* (2013.01); *G06F 3/0482* (2013.01); *G06F 30/20* (2020.01); *G08B 21/0297* (2013.01); *G08B 29/22* (2013.01)

(58) Field of Classification Search
CPC .............................. G08B 25/14; G06F 21/552
(Continued)

(56) References Cited

U.S. PATENT DOCUMENTS 8,810,415 B2 8/2014 Grundler et al.
2003/0050713 A1 3/2003 Piersanti et al.
(Continued)

FOREIGN PATENT DOCUMENTS

AU 199954046 A1 3/2000
CN 1412723 A 4/2003
(Continued)

OTHER PUBLICATIONS

European Communication Pursuant to Article 94(3) EPC Examination Report for related European Application No. 20166031.3, mailed Mar. 3, 2022 (10 pgs).
(Continued)

*Primary Examiner* — Fabricio R Murillo Garcia
(74) *Attorney, Agent, or Firm* — Brooks, Cameron & Huebsch, PLLC

(57) ABSTRACT

Systems and methods are provided that can include receiving a plurality of cause and effect rules for a security system that protects a secured area, simulating a plurality of cause and effect rules responsive to user input identifying an emergency event in one of a plurality of zones of the secured area, and during simulation, displaying on a graphical user interface a first indicator that identifies a first output of a first of the plurality of cause and effect rules within a first of the plurality of zones.

18 Claims, 28 Drawing Sheets

Related U.S. Application Data continuation of application No. 16/371,455, filed on Apr. 1, 2019, now Pat. No. 10,726,713.

(51) Int. Cl.
*G06F 30/20* (2020.01)
*G08B 21/02* (2006.01)
*G08B 29/22* (2006.01)

(58) Field of Classification Search
USPC ........................................... 340/541
See application file for complete search history.

(56) References Cited

U.S. PATENT DOCUMENTS

| | | | | |
|---|---|---|---|---|
| 2010/0122208 | A1* | 5/2010 | Herr | G06F 3/04845 715/810 |
| 2010/0323334 | A1* | 12/2010 | Goforth | G09B 19/00 434/219 |
| 2011/0178697 | A1* | 7/2011 | Mincey | G01C 21/3644 701/532 |
| 2011/0257942 | A1 | 10/2011 | Ankory et al. | |
| 2012/0105227 | A1* | 5/2012 | Angell | G08B 25/007 340/8.1 |
| 2014/0025347 | A1 | 1/2014 | Kim et al. | |
| 2014/0068486 | A1 | 3/2014 | Sellers et al. | |
| 2014/0313046 | A1 | 10/2014 | Childers | |
| 2015/0052469 | A1 | 2/2015 | Dharmalingam et al. | |
| 2018/0283714 | A1* | 10/2018 | Smithson | F24F 11/65 |
| 2019/0089742 | A1* | 3/2019 | Hill | H04L 63/101 |
| 2019/0212754 | A1 | 7/2019 | Smith | |
| 2020/0294372 | A1* | 9/2020 | Rodriguez | G08B 21/02 |
| 2023/0310915 | A1* | 10/2023 | Schmitt | A62C 3/00 700/282 |

FOREIGN PATENT DOCUMENTS

| | | |
|---|---|---|
| CN | 102509410 A | 6/2012 |
| EP | 1293945 A1 | 3/2003 |
| EP | 3229216 | 10/2017 |
| EP | 3229216 A1 | 11/2017 |
| JP | 2015-41110 A | 3/2015 |
| WO | 2014004911 A2 | 1/2014 |
| WO | 2016154312 A1 | 9/2016 |

OTHER PUBLICATIONS

English language translation of Bibliographic data for AU5404699 (A) [Application No. AU19990054046], Abstract not available for AU5404699 (A), Abstract of corresponding document: WO0014693 (A1); Description of AU5404699 (A); Claims of AU5404699 (A).
English language translation of bibliographic data and abstract of CN 1412723(A).
English language translation of abstract, claims, and description of CN1412723A.
English language translation of bibliographic data and abstract of CN 102509410 (A).
English language translation of abstract, claims, and description of CN102509410A.
English language translation of bibliographic data and abstract of EP1293945 (A1).
English language translation of abstract, claims, and description of Ep 1293945A1.
English language translation of bibliographic data and abstract of JP2015041110 (A).
English language translation of abstract, claims, and description of JP201504111 0A.
Bin Wang et al., School of Engineering, Cardiff University, BIM Based Virtual Environment for Fire Emergency Evacuation, Hindawi Publishing Corporation, The Scientific World Journal, vol. 2014, Article ID 589016, 22 pages, http://dx.doi.Org/10.1155/2014/589016, Copyright @ 2014.
Vancho Adjiski et al., Faculty of Natural and Technical Sciences, Mining Engineering, "Goce Delcheu" University, Shtip, Macedonia, Simulation and optimization of evacuation routes in case of fire in underground mines, Journal of Sustainable Mining 14 (2015) 133-143.
Smartdraw, Fire Escape Plan Maker, Oct. 19, 2017.
European Extended Search report for related European Application No. 20166031.3-1206, mailed Aug. 27, 2020 (11 pgs).

* cited by examiner

| ZONE INFORMATION | EMERGENCY EXIT | DISTANCE FACTOR TO THE EXIT |
|---|---|---|
| ZONE 1 | E1 | 1 |
| ZONE 2 | E1 | 1 |
| ZONE 3 | E1 | 2 |
| ZONE 4 | E1 | 2 |
| ZONE 5 | E1 | 3 |
| ZONE 6 | E1 | 3 |
| ZONE 7 | E1 | 4 |
| ZONE 8 | E1 | 4 |
| ZONE 9 | E2 | 4 |
| ZONE 10 | E2 | 4 |
| ZONE 11 | E2 | 3 |
| ZONE 12 | E2 | 3 |
| ZONE 13 | E2 | 2 |
| ZONE 14 | E2 | 2 |
| ZONE 15 | E2 | 1 |
| ZONE 16 | E2 | 1 |

FIG. 23

| ZONE INFORMATION | EMERGENCY EXIT | DISTANCE FACTOR TO THE EXIT (dF) | RELATIVE DISTANCE TO THE FIRE ZONE (dZ) | ALERT SEQUENCE FACTOR ASF= (dF*dZ) | REMARKS |
|---|---|---|---|---|---|
| ZONE 1 | E1 | 1 | 1 | 1 | THIRD ALERT |
| ZONE 2 | E1 | 1 | 1 | 1 | THIRD ALERT |
| ZONE 3 | E1 | 2 | 0 | 0 | FIRE |
| ZONE 4 | E1 | 2 | 0 | 0 | FIRE |
| ZONE 5 | E1 | 3 | 1 | 3 | SECOND ALERT |
| ZONE 6 | E1 | 3 | 1 | 3 | SECOND ALERT |
| ZONE 7 | E1 | 4 | 2 | 8 | FIRST ALERT |
| ZONE 8 | E1 | 4 | 2 | 8 | FIRST ALERT |
| ZONE 9 | E2 | 4 | 3 | 12 | |
| ZONE 10 | E2 | 4 | 3 | 12 | |
| ZONE 11 | E2 | 3 | 4 | 12 | |
| ZONE 12 | E2 | 3 | 4 | 12 | |
| ZONE 13 | E2 | 2 | 5 | 10 | |
| ZONE 14 | E2 | 2 | 5 | 10 | |
| ZONE 15 | E2 | 1 | 6 | 6 | |
| ZONE 16 | E2 | 1 | 6 | 6 | |

SYSTEMS AND METHODS FOR COMMISSIONING A SECURITY SYSTEM

PRIORITY INFORMATION

This application is a Continuation of U.S. application Ser. No. 16/941,296, filed Jul. 28, 2020, which is a Continuation of U.S. application Ser. No. 16/371,455, filed Apr. 1, 2019, which issued as U.S. Pat. No. 10,726,713 on Jul. 28, 2020, the contents of which are incorporated herein by reference.

FIELD

The present invention relates generally to security systems. More particularly, the present invention relates to systems and methods for commissioning a security system.

BACKGROUND

Security systems are known to detect threats within a secured area, and such threats can include events that represent a risk to human safety or a risk to assets.

Security systems typically include one or more security sensors that detect the threats within the secured area. For example, smoke, motion, and/or intrusion sensors can be distributed throughout the secured area in order to detect the threats. Furthermore, security systems typically include notification appliances, such as sounders and strobe lights, to notify occupants of an emergency.

Commissioning a security system is very laborious and time-consuming. For example, known systems and methods for commissioning security systems involve a commissioning engineer (CE) manually creating rules and manually entering multi-line configuration data into a table or a spreadsheet. As such, there is a need for simpler and faster systems and methods for commissioning security systems.

BRIEF DESCRIPTION OF THE DRAWINGS

FIG. 2 is a graphical user interface displayed on a user terminal in accordance with disclosed embodiments;

FIG. 16 is a graphical user interface displayed on a user terminal in accordance with disclosed embodiments;

FIG. 23 is a table of zone distance factors for a plurality of zones in a floor plan in accordance with disclosed embodiments;

FIG. 24 is a table of alert sequence factors for a plurality of zones in a floor plan in accordance with disclosed embodiments;

DETAILED DESCRIPTION

Figure 1:
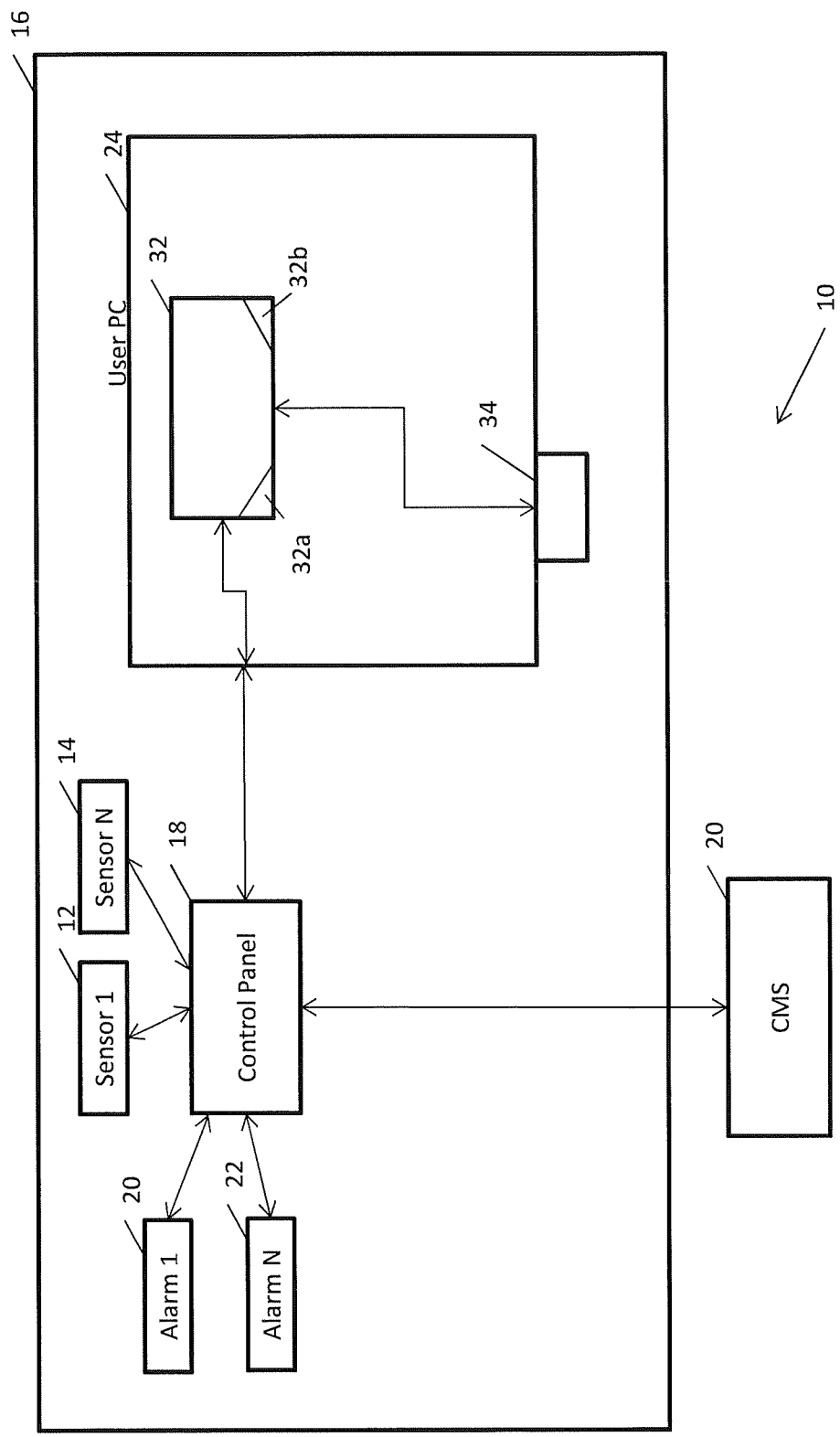
FIG. 1 is a block diagram of a system in accordance with disclosed embodiments.

While this invention is susceptible of an embodiment in many different forms, there are shown in the drawings and will be described herein in detail specific embodiments thereof with the understanding that the present disclosure is to be considered as an exemplification of the principles of the invention. It is not intended to limit the invention to the specific illustrated embodiments.

Embodiments disclosed herein can include systems and methods for commissioning a security system and automatically defining, creating, and generating cause and effect rules for the security system. For example, systems and methods disclosed herein can display a graphical user interface (GUI) on a user terminal, such as a personal computer, a tablet, or a smartphone, with a floor plan of a secured area monitored by the security system and can receive user input via the floor flan displayed on the GUI for defining and identifying a plurality of zones of the secured area, drawing or otherwise identifying a respective evacuation route from each of the plurality of zones, customizing changes to the cause and effect rules via graphically-displayed widgets, and graphically simulating the cause and effect rules as customized, results of which can be displayed on the GUI.

In some embodiments, responsive to receiving user input, systems and methods disclosed herein can automatically define, create, and generate the cause and effect rules. For example, the user input can define and identify respective boundaries of each of the plurality of zones drawn on the floor plan and can identify the respective evacuation route from each of the plurality of zones drawn on the floor plan. In some embodiments, systems and methods disclosed herein can retrieve building data stored in a building information model (BIM) file of the secured area, which can be stored in a computer-readable memory, to identify respective distances between each of the plurality of zones and emergency exits in the secured area, and in some embodiments, the BIM file can include an industrial foundation classes (IFC) file with structural data about the secured area, such as locations of walls, doors, and the emergency exits. Accordingly, in some embodiments, the floor plan can be generated from the building data retrieved from the BIM file.

After automatically defining, creating, and generating the cause and effect rules, systems and methods disclosed herein can receive user input with instructions to simulate the cause and effect rules, and in some embodiments, the cause and effect rules can be simulated graphically via the GUI. For example, during simulation, activated alarms in some of the plurality of zones can flash or change color on the floor plan, and the GUI can display alarm and alert notifications in real-time to correspond with output of the cause and effect rules.

FIG. 1 is a block diagram of a security system 10 in accordance with disclosed embodiments. As seen in FIG. 1, the security system 10 can include one or more security sensors 12, 14 that can monitor a secured area 16 for threats, and in some embodiments, the security sensors 12, 14 can include intrusion, camera, motion, fire, smoke, and gas detectors. The security sensors 12, 14 can communicate with a control panel 18, and the control panel 18 can monitor for activation of the security sensors 12, 14.

In some embodiments, the control panel 18 may send an alarm message to a central monitoring station 20 upon the activation of one of the security sensors 12, 14, and the central monitoring station 20 can respond by summoning the appropriate help. For example, if the one of the security sensors 12, 14 detects a fire, then the central monitoring station 20 may summon a local fire department. Alternatively, if the one of the security sensors 12, 14 detects an intrusion, then the central monitoring station 20 may summon the police. Additionally, the control panel 18 can send an activation message to one or more alarm notification devices 20, 22, and the alarm notification devices 20, 22 can activate a visual or audible alarm to notify occupants of the secured area 16 about the threats.

The control panel 18 can also communicate with a user terminal 24, and the user terminal 24 can implement, store, and execute software that can display a GUI on a user interface device 34 or other display of the user terminal 24 to assist a CE in commissioning the security system 10. The user interface device 34 can include a keyboard, a mouse, or a touchscreen that can receive user input that the user terminal 24 can use to define, create, and generate cause and effect rules for the security system 10. Then, the user terminal 24 can transmit the cause and effect rules to the control panel 18, and the control panel can function in accordance with the cause and effect rules.

The user terminal 24 can include control circuitry 32, which can include a programmable processor 32a and executable control software 32b as would be understood by one of ordinary skill in the art. The executable control software 32b can be stored on a transitory or non-transitory computer readable medium, including, but not limited to local computer memory, RAM, optical storage media, magnetic storage media, and the like. In some embodiments, the control circuitry 32, the programmable processor 32a, and the executable control software 32b can execute and control some of the methods disclosed herein, such as, for example, displaying the GUI, receiving user input to define the cause and effect rules, and, responsive thereto, creating and generating the cause and effect rules.

Figure 2:
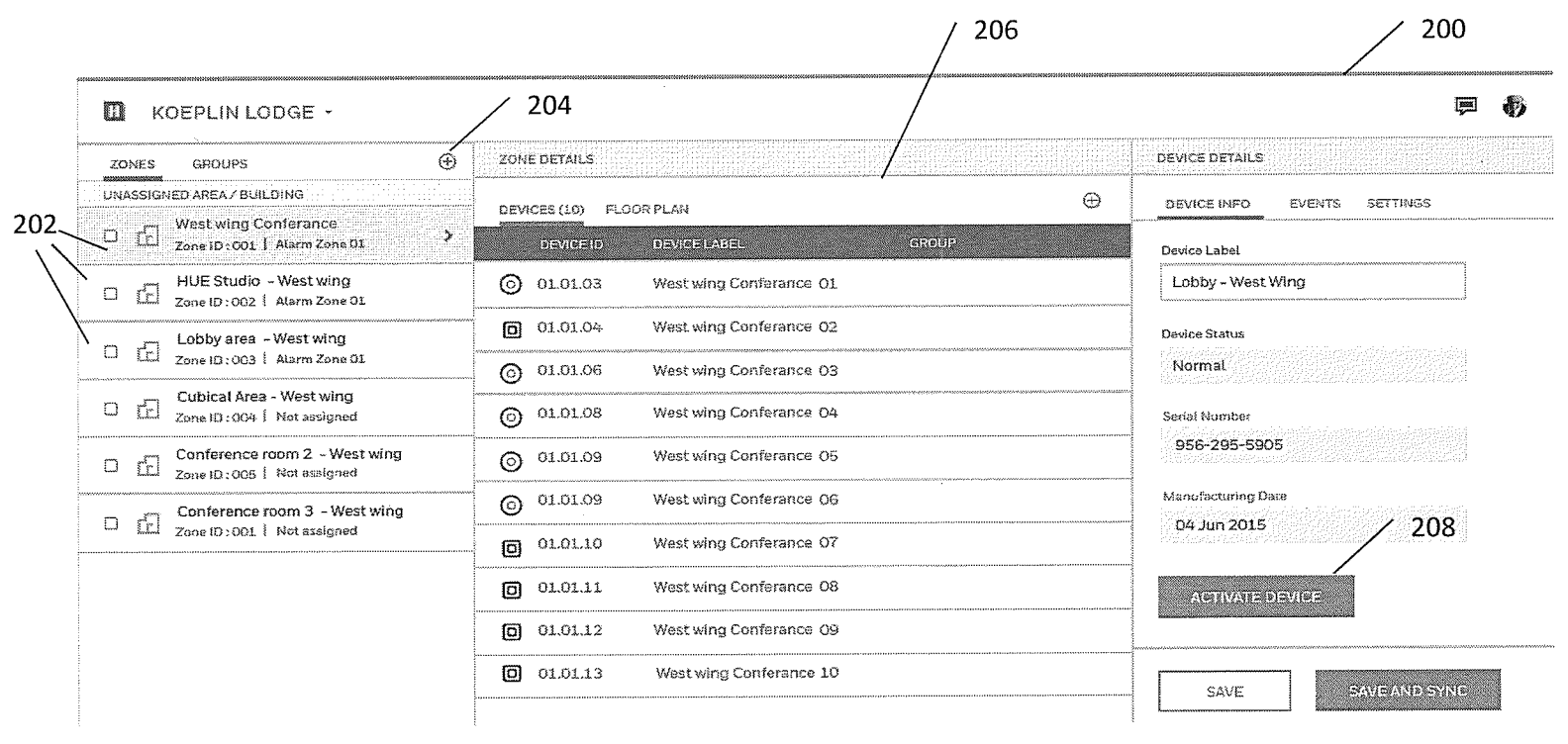

FIG. 2 is a GUI 200 that can be displayed on the user interface device 34 of the user terminal 24 as part of commissioning the security system 10 in accordance disclosed embodiments. In some embodiments, systems and methods disclosed herein can retrieve a BIM file from a memory device to identify information to be displayed in the GUI 200.

First, the GUI 200 can receive user input to define and identify a plurality of zones 202 of the secured area 16 monitored by the security system 10. For example, the GUI 200 can display an add zone button 204, and responsive to the GUI 200 receiving user input of the CE selecting the add zone button 204, systems and methods disclosed herein can identify a new one of the plurality of zones 202 and identify the new one of the plurality of zones 202 with a name identified by the user input. Then, the GUI 200 can receive user input with instructions from the CE to add security system devices 12, 14, 20, or 22 to the new one of the plurality of zones 202. For example, the GUI 200 can display a device area 206 that can receive user input of the CE identifying names for the security system devices 12, 14, 20, or 22, and responsive thereto, the GUI 200 can display respective information for each of the security system devices 12, 14, 20, or 22, such as a respective status, a respective serial number, a respective manufacturing date, and respective events detected by a respective one of the security system devices 12, 14, 20, or 22. Finally, the GUI 200 can display an activate device button 208, and responsive to the GUI 200 receiving user input of the CE selecting the activate device button 208 for a selected one of the security system devices 12, 14, 20, or 22, systems and methods disclosed herein can activate the selected one of the security system devices 12, 14, 20, or 22.

Figure 3:
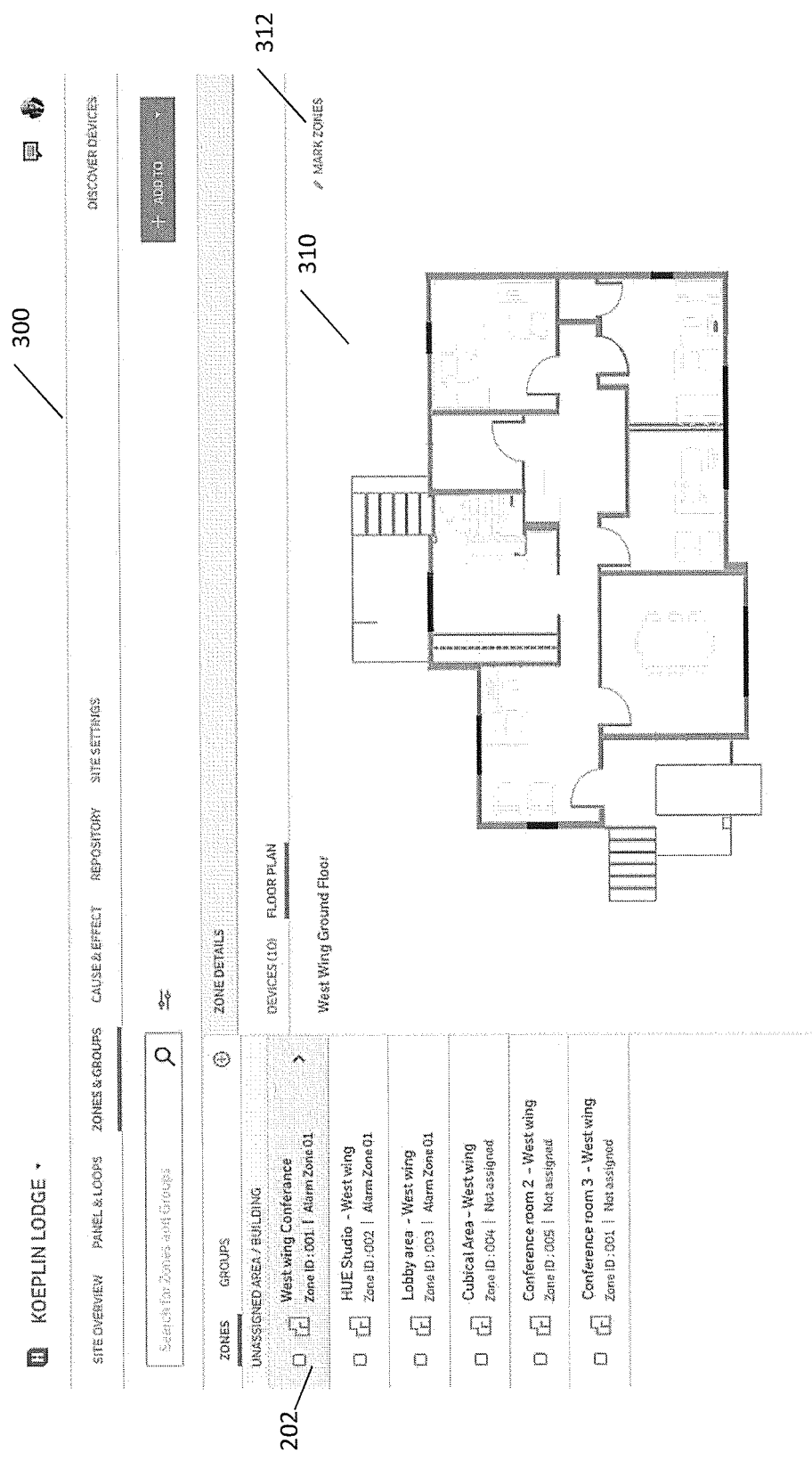
FIG. 3 is a graphical user interface displayed on a user terminal in accordance with disclosed embodiments.

After identifying the new one of the plurality of zones 202 responsive to the GUI 200 receiving user input, systems and methods disclosed herein can display a floor plan 310 of the secured area 16 to define the new one of the plurality of zone 202. For example, FIG. 3 is a GUI 300 that can be displayed on the user interface device 34 of the user terminal 24 in accordance with disclosed embodiments. In some embodiments, systems and methods disclosed herein can process building data from the BIM file to generate and display the floor plan 310. As seen, the GUI 300 can display a mark zones button 312, and responsive to the GUI 300 receiving user input of the CE selecting the mark zones button 312 and selecting the new one of the plurality of zones 202 ("West Wing Conference"), systems and methods disclosed herein can receive user input defining metes and bounds of the new one of the plurality of zones 202.

Figure 4:
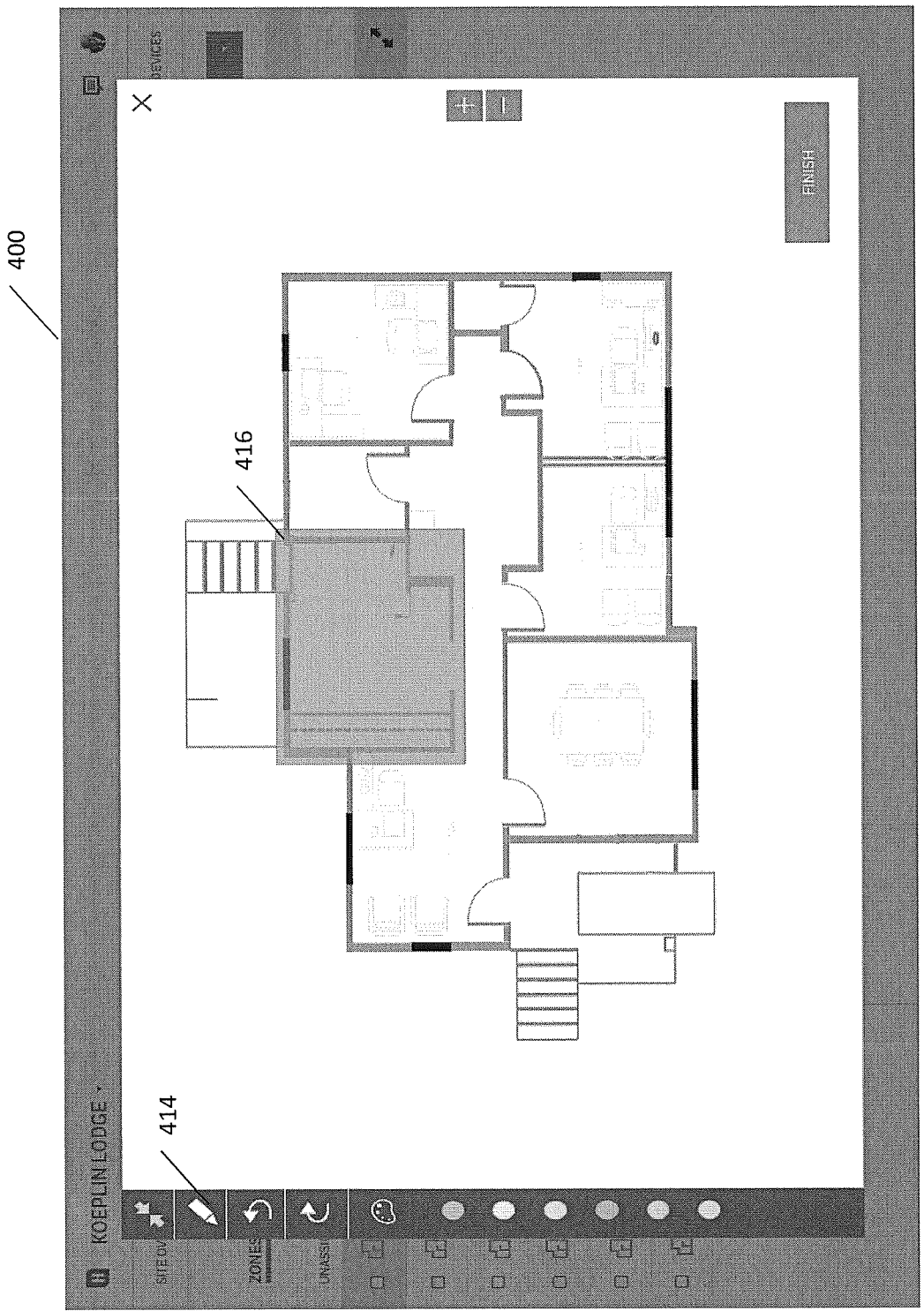
FIG. 4 is a graphical user interface displayed on a user terminal in accordance with disclosed embodiments.

For example, FIG. 4 is a GUI 400 that can be displayed on the user interface device 34 of the user terminal. As seen, the GUI 400 can display a zone drawing tool button 414, and responsive to the GUI 400 receiving user input of the CE selecting the zone drawing tool button 414, systems and methods disclosed herein can receive user input of the CE defining the metes and bounds of the new one of the plurality of zones 202. For example, the GUI 400 can receive an identification of an outline of a drawn zone 416 on the floor plan or an identification of a shape (e.g. a rectangle) for the drawn zone 416. Then, systems and methods disclosed herein can associate BIM coordinates of the drawn zone 416 with the new one of the plurality of zones 202.

Figure 19:
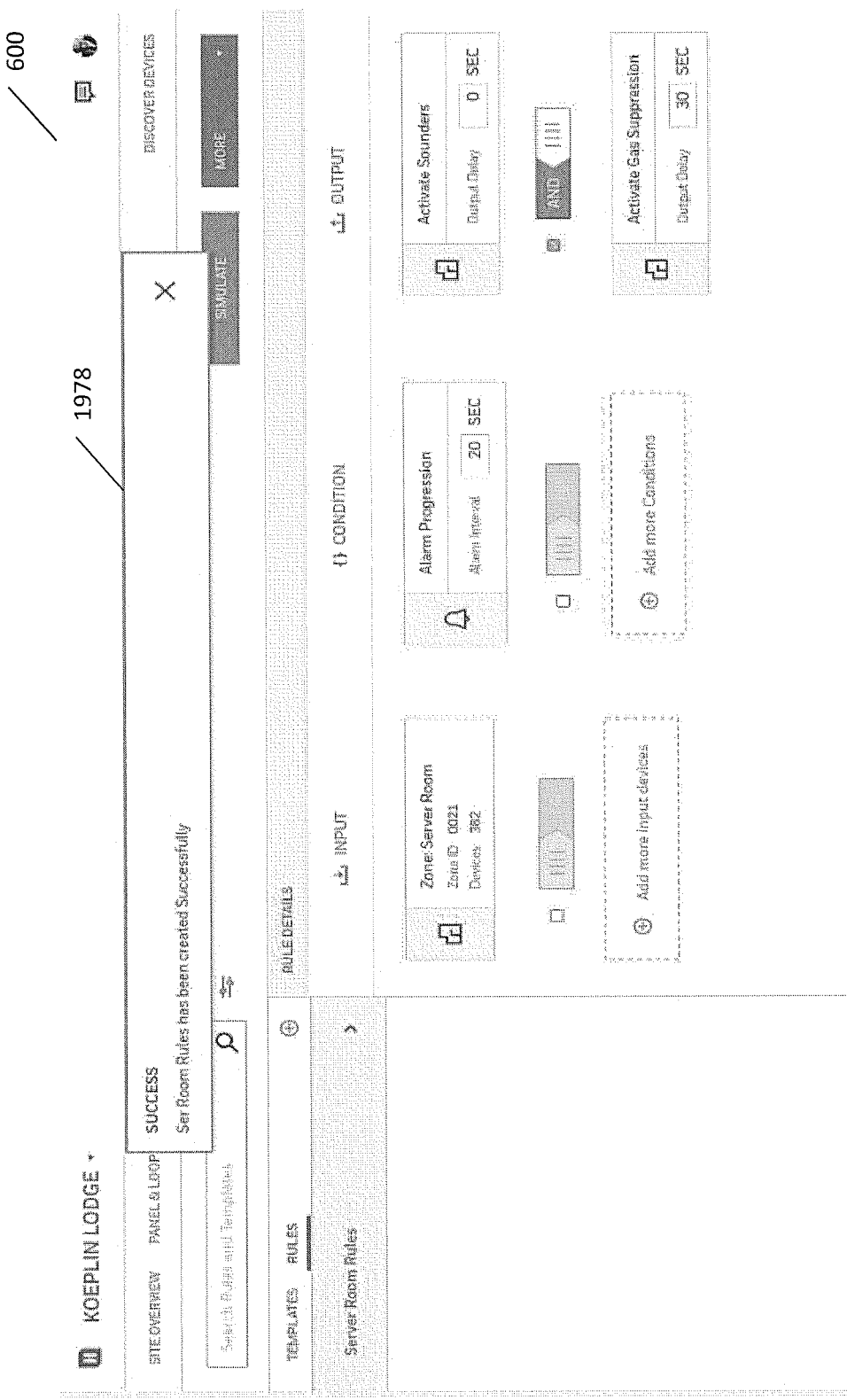
FIG. 19 is a graphical user interface displayed on a user terminal in accordance with disclosed embodiments.
Figure 20:
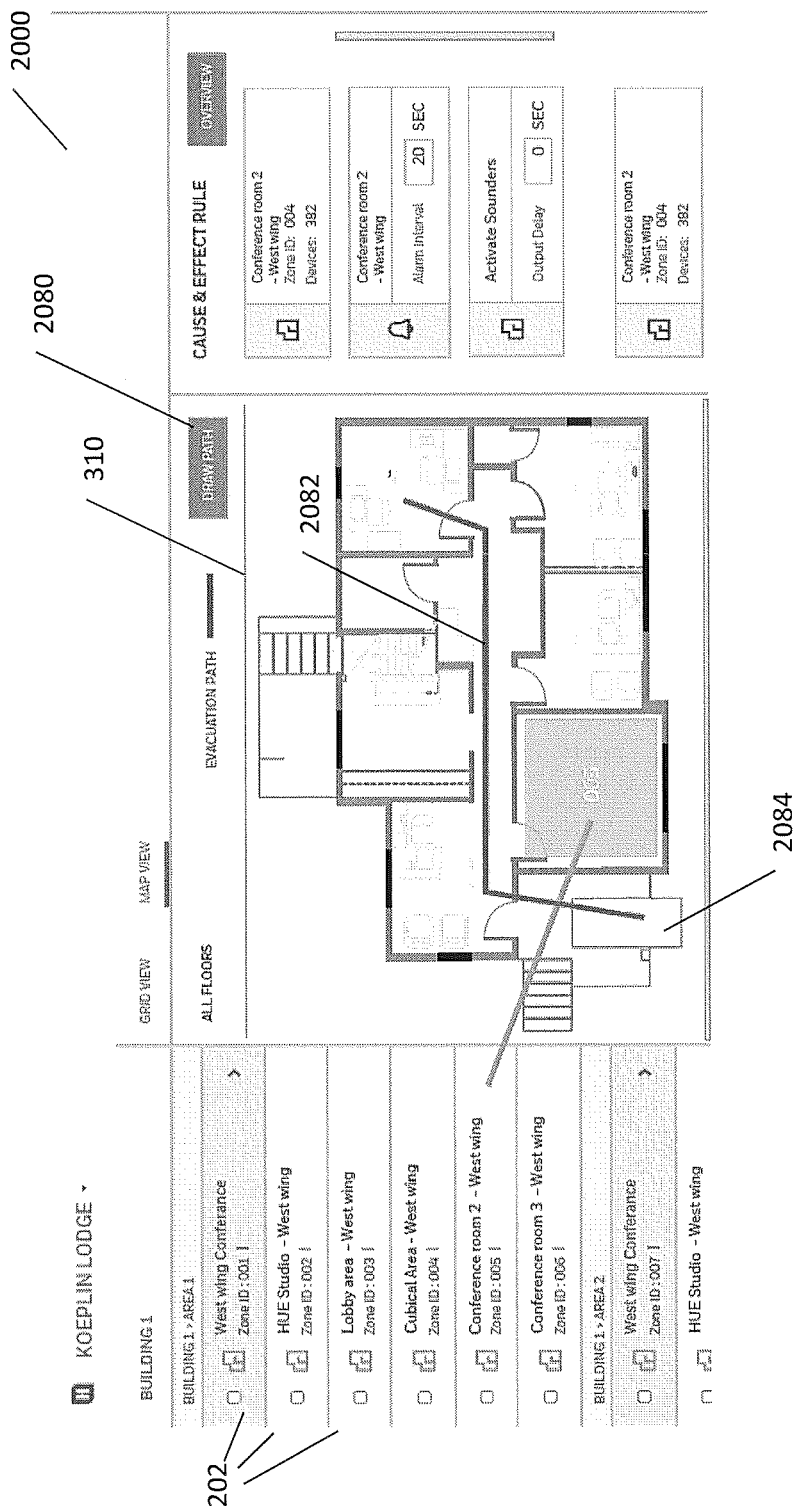
FIG. 20 is a graphical user interface displayed on a user terminal in accordance with disclosed embodiments.
Figure 21:
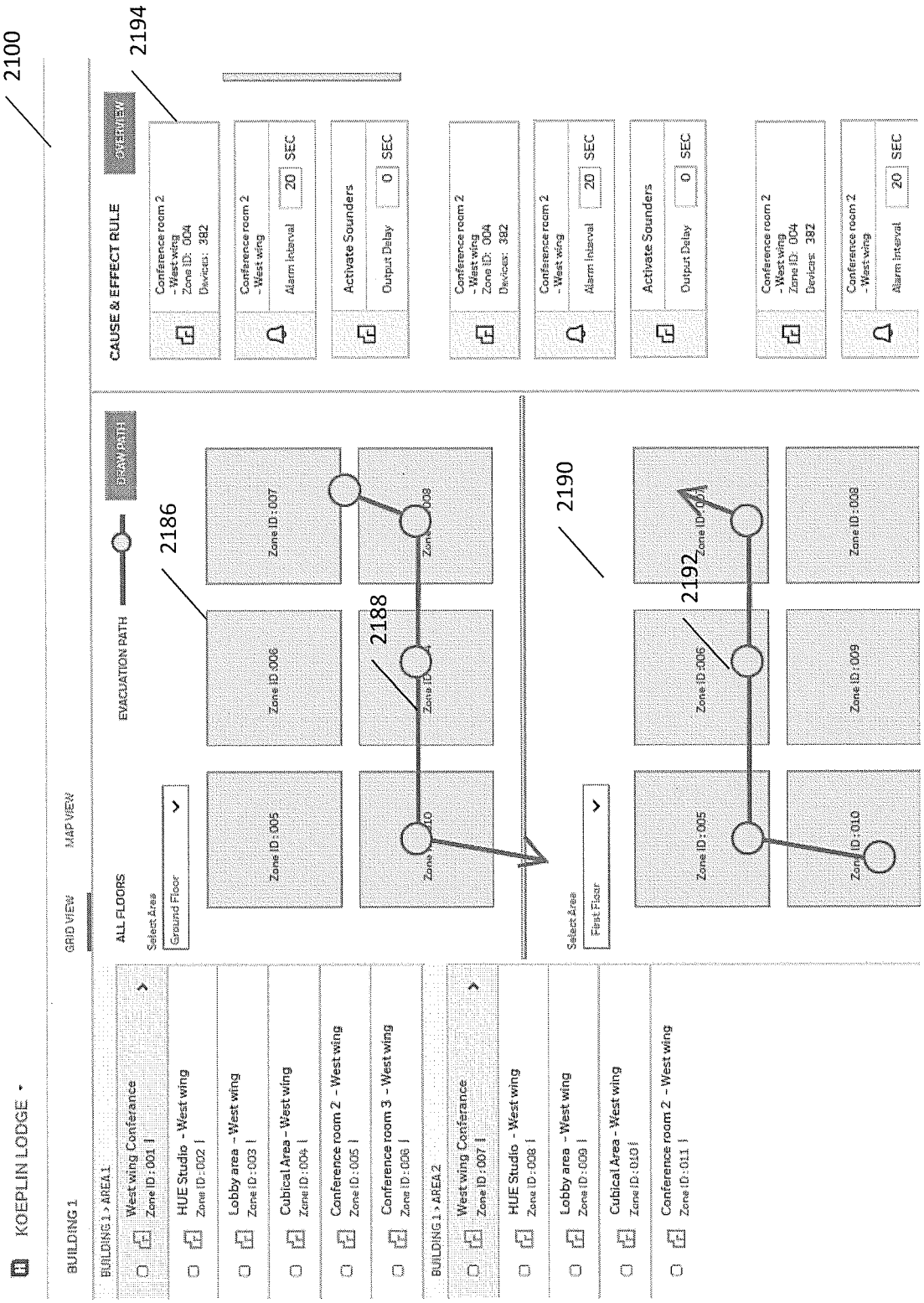
FIG. 21 is a graphical user interface displayed on a user terminal in accordance with disclosed embodiments.

After identifying the new one of the plurality of zones 202 and assigning security system devices to the new one of the plurality of zones 202 responsive to the GUI 200 receiving user input and defining the metes and bounds of the new one of the plurality of zones 202 via the GUI 300 and the GUI 400 receiving user input, systems and methods disclosed herein can define the cause and effect rules for the security system 10 either manually using configurable widgets or automatically using drawn evacuation routes. FIGS. 5-19 are GUIs that can be displayed on the user interface device 34 of the user terminal 24 for manually defining the cause and effect rules with the configurable widgets, and FIGS. 20-21 are GUIs that can be displayed on the user interface 34 of the user terminal 24 for automatically defining the cause and effect rules with the drawn evacuation routes.

Figure 5:
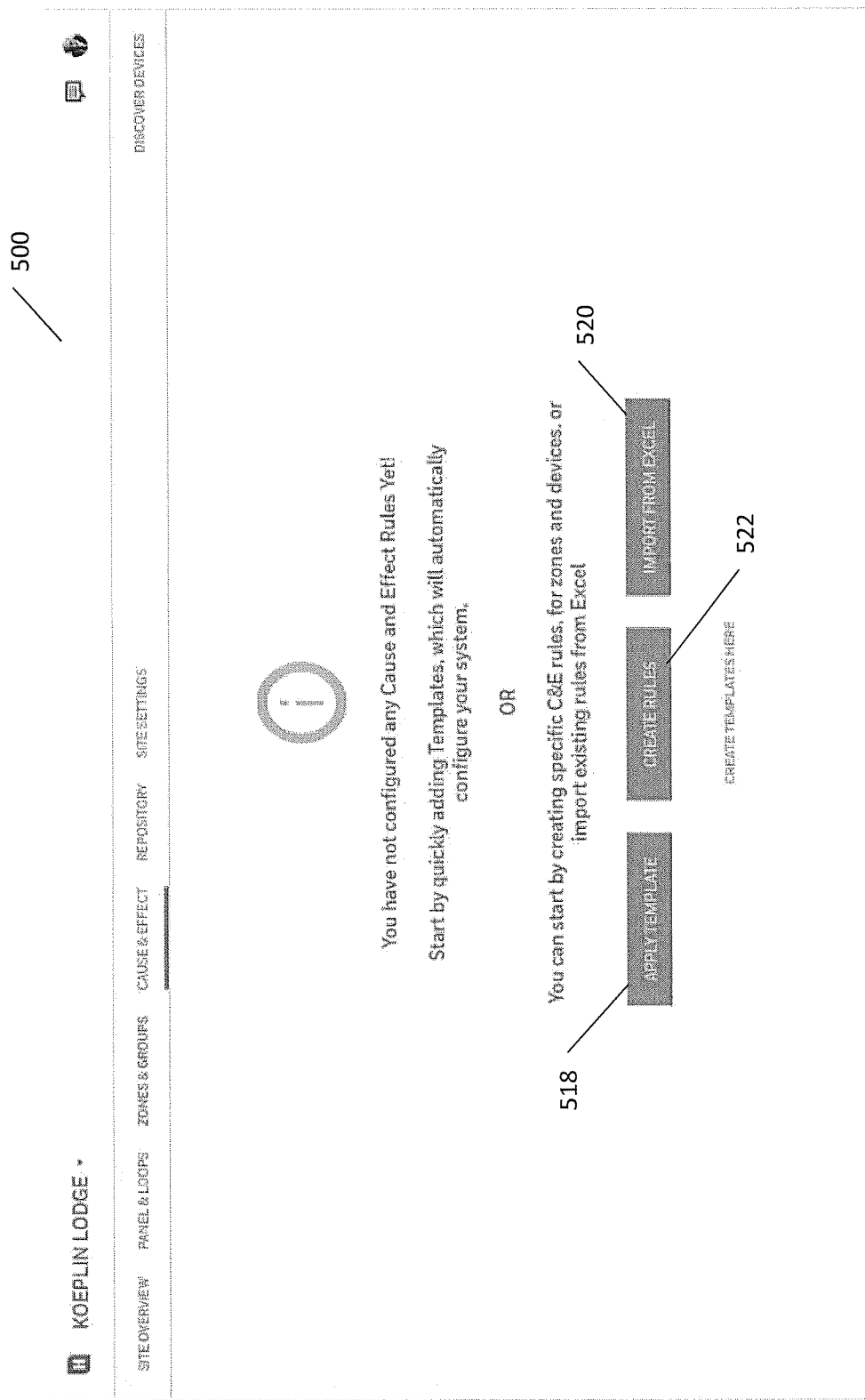
FIG. 5 is a graphical user interface displayed on a user terminal in accordance with disclosed embodiments.

For example, as seen in FIG. 5, systems and methods disclosed herein can display a GUI 500 when none of the cause and effect rules have been defined, and the GUI 500 can display an apply template button 518, an import from excel button 520, and a create rules button 522. Responsive to the GUI 500 receiving user input of the CE selecting the apply template button 518, systems and method disclosed herein can retrieve previously saved templates saved in the memory device. Additionally or alternatively, responsive to the GUI 500 receiving user input of the CE selecting the import from excel button 520, systems and methods disclosed herein can retrieve a spreadsheet (e.g. .xls, .csv) saved in the memory device and convert the cause and effect rules in the spreadsheet into widgets for display.

Figure 6:
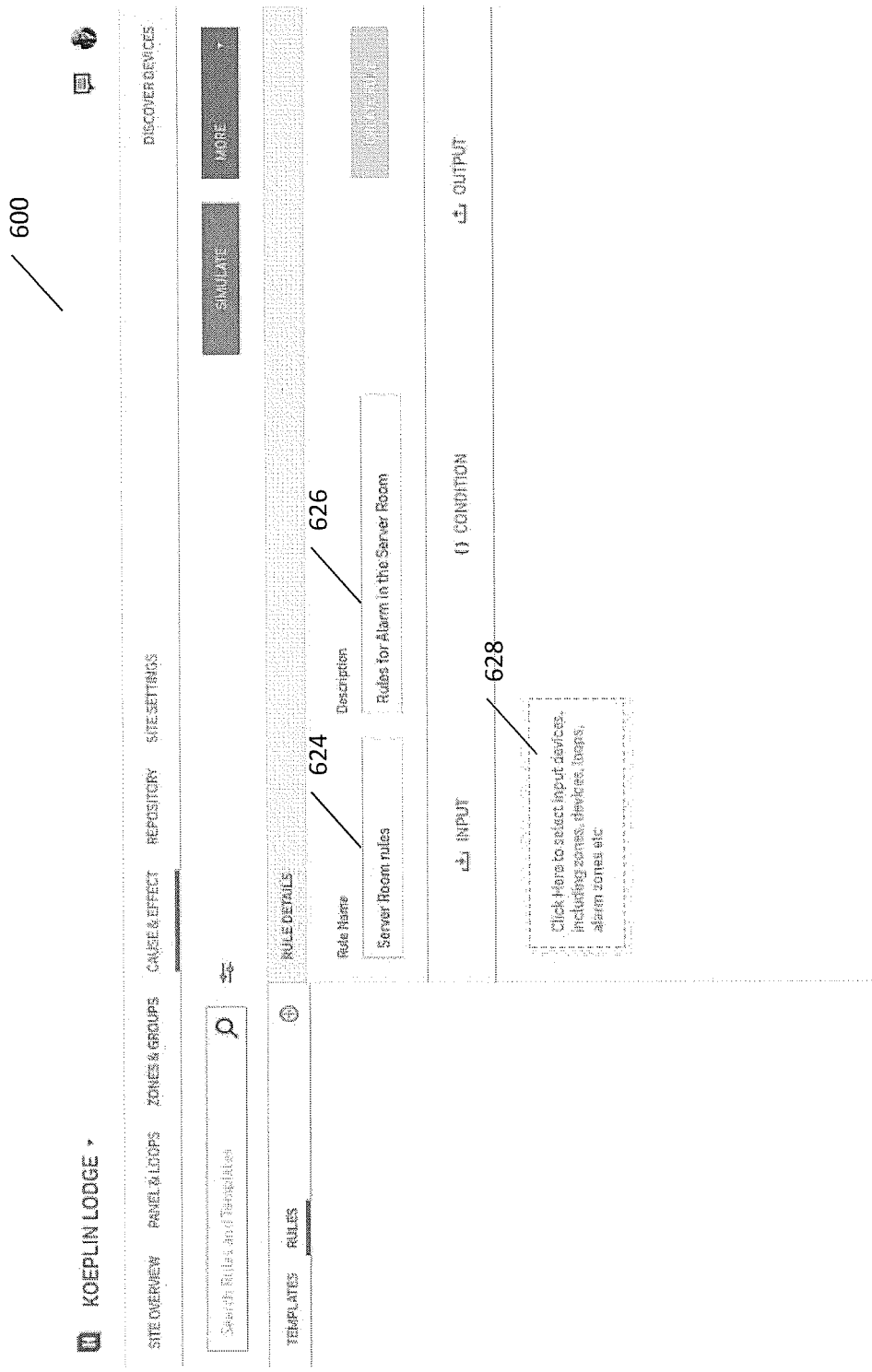
FIG. 6 is a graphical user interface displayed on a user terminal in accordance with disclosed embodiments.

Additionally or alternatively, responsive to the GUI 500 receiving user input of the CE selecting the create rules button 522, systems and methods disclosed herein can display a GUI 600 as seen in FIG. 6. The GUI 600 can display a rule name box 624, a rule description box 626, and an input selection area 628. Responsive to the GUI 600 receiving user input of the CE selecting the rule name box 624, systems and methods disclosed herein can identify a rule name for a new one of the cause and effect rules. Responsive to the GUI 600 receiving user input of the CE selecting the rule description box 626, systems and methods disclosed herein can associate a description identified by the user input with the new one of the cause and effect rules.

Figure 7:
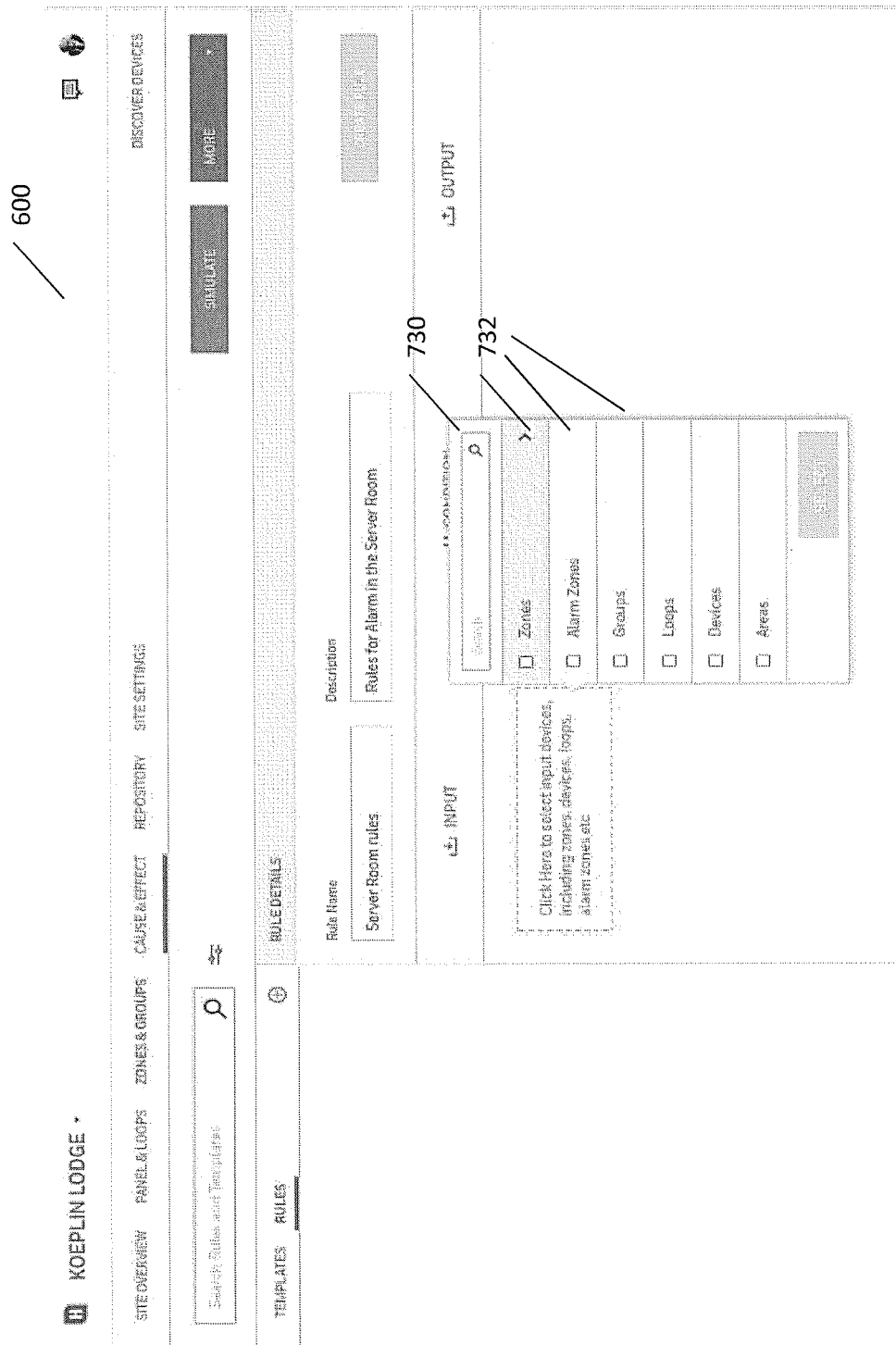
FIG. 7 is a graphical user interface displayed on a user terminal in accordance with disclosed embodiments.

Responsive to the GUI 600 receiving user input of the CE selecting the input selection area 628, the GUI 600 can display an input selection pop-up window 730 that includes input menu selections 732 displayed therein as seen in FIG. 7. Responsive to the GUI 600 receiving user input of the CE selecting one or more of the input menu selections 732, systems and methods disclosed herein can identify a corresponding plurality of events and triggers as input for the new one of the cause and effect rules. For example, the input can include any sensor detecting any alarm condition in an identified zone, any sensor detecting any alarm condition in any zone in alarm, an identified group of sensors detecting any alarm condition, sensors in an identified loop detecting any alarm condition, an identified sensor detecting any alarm condition, or any sensor detecting any alarm condition in an identified area.

Figure 8:
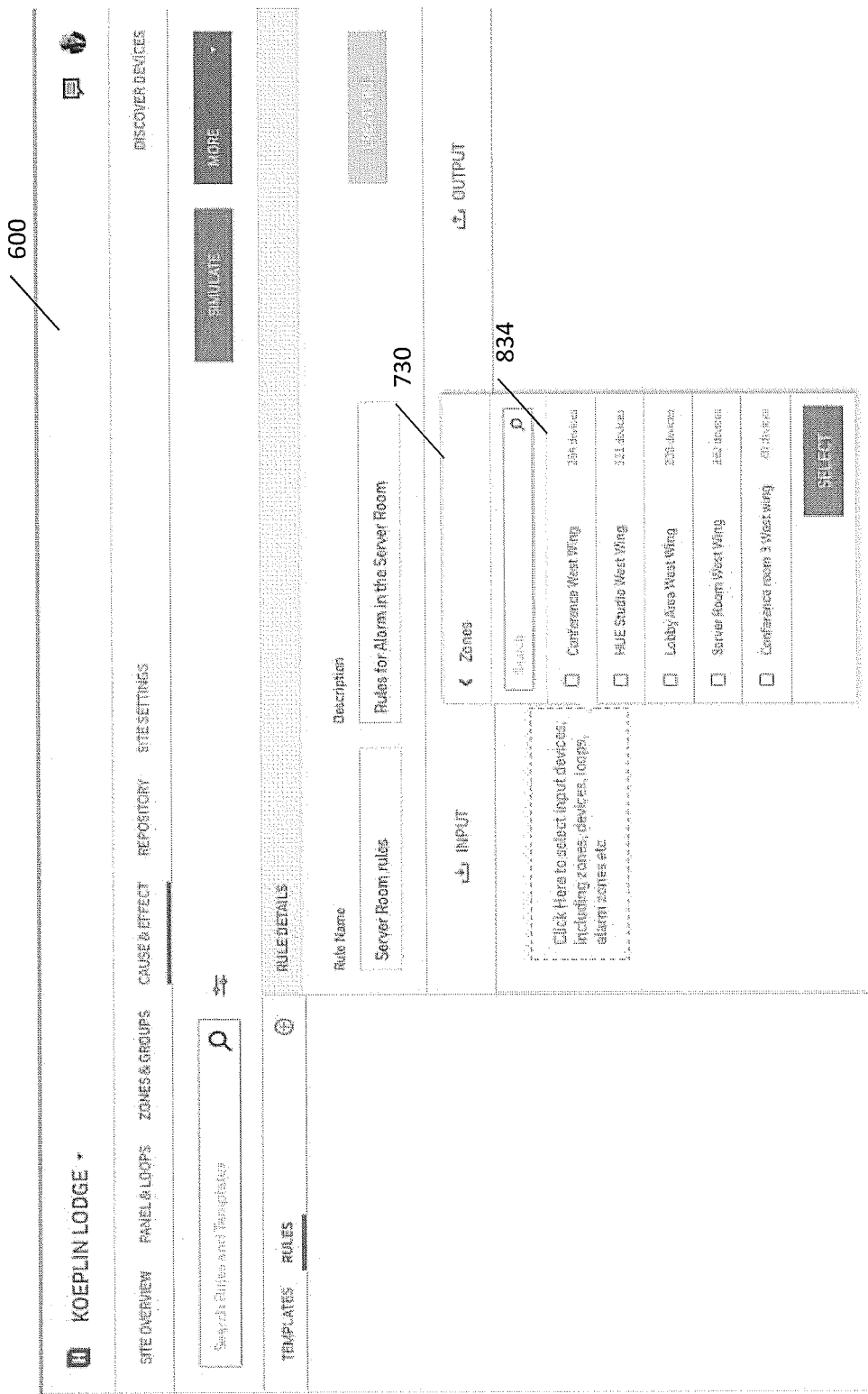
FIG. 8 is a graphical user interface displayed on a user terminal in accordance with disclosed embodiments.
Figure 9:
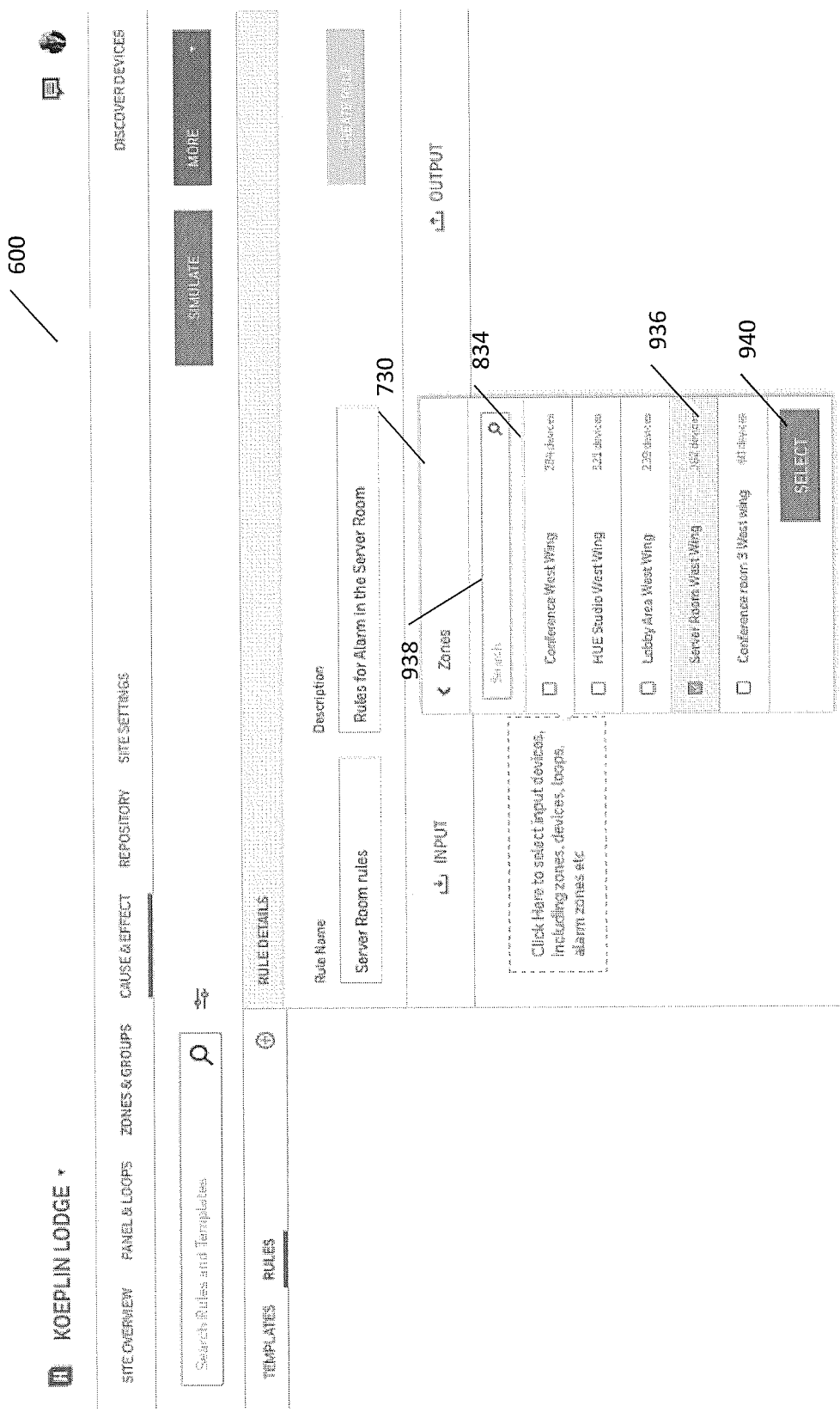
FIG. 9 is a graphical user interface displayed on a user terminal in accordance with disclosed embodiments.

Responsive to the GUI 600 receiving user input of the CE selecting any of the input menu selections 732 (e.g. "Zone"), the GUI 600 can display the input selection pop-up window 730 with a list of zones 834 that includes the new one of the plurality of zones 202, a search bar 938, and a selection button 940 displayed therein as seen in FIG. 8 and in FIG. 9. Responsive to the GUI 600 receiving user input of the CE selecting a selected zone 936 ("Server Room West Wing") from the list of zones 834, systems and methods disclosed herein can identify the selected zone 936. Additionally or alternatively, responsive to the GUI 600 receiving user input of the CE entering text into the search bar 938, systems and methods disclosed herein can assist the CE in selecting the selected zone 936 from the list of zones 834, for example, by displaying entries in the list of zones 834 that match the text entered into the search bar 938. It is to be understood that systems and methods disclosed herein can identify more than one entry on the list of zones 834.

Figure 10:
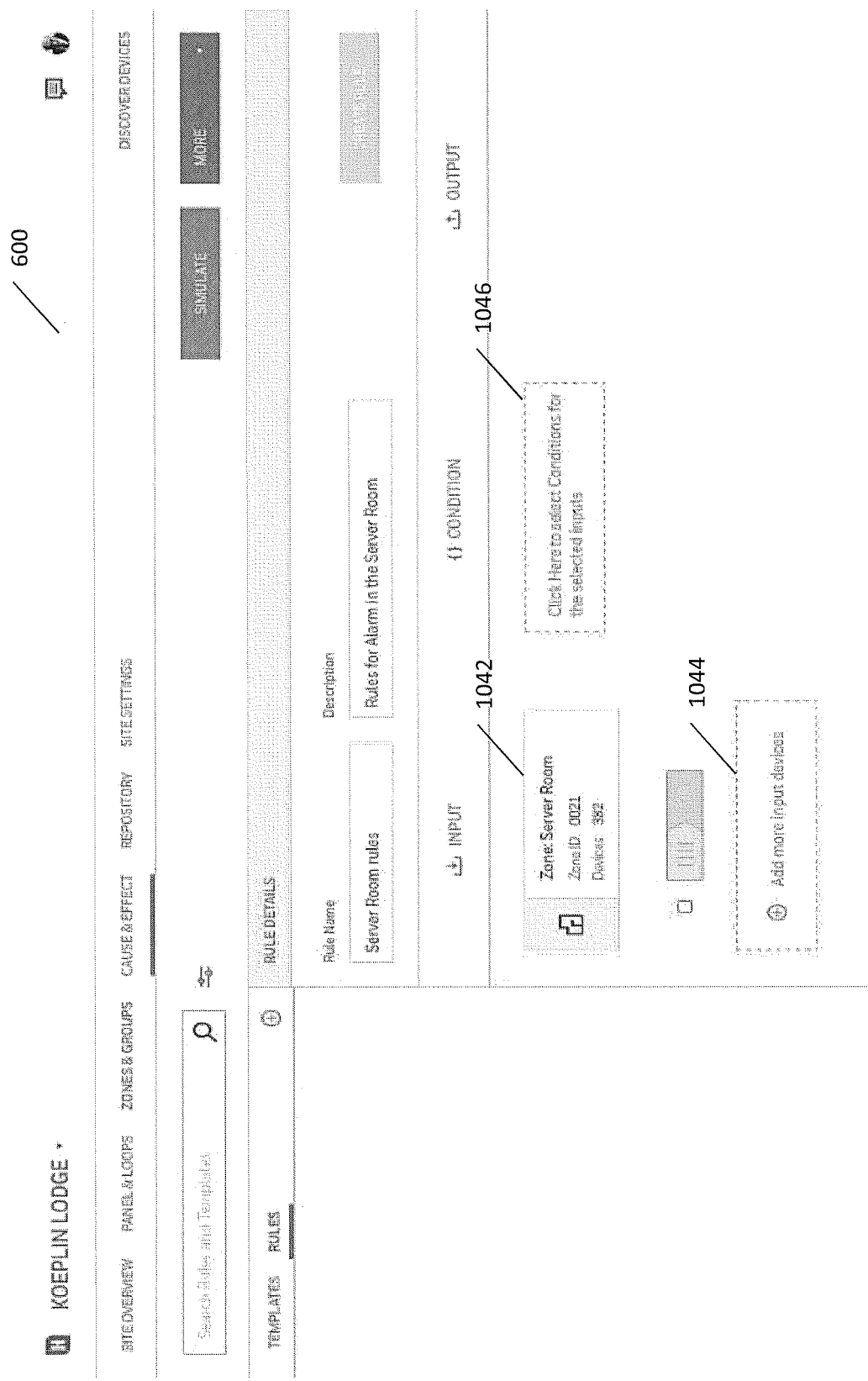
FIG. 10 is a graphical user interface displayed on a user terminal in accordance with disclosed embodiments.

Responsive to the GUI 600 receiving user input of the CE selecting the selection button 940, the GUI 600 can display an input widget 1042, an input selection area 1044, and a condition selection area 1046 as seen in FIG. 10. The input widget 1042 can display identifying information about the input selected for the new one of the cause and effect rules, such as a type of the input selected for the new one of the cause and effect rules, any of the plurality of zones associated with the input selected for the new one of the cause and effect rules, device(s) associated with the input selected for the new one of the cause and effect rules, a number of the devices in the plurality of zones associated with the input selected for the new one of the cause and effect rules, etc. Responsive to the GUI 600 receiving user input of the CE selecting the input selection area 1044 and identifying additional items for the input for the new one of the cause and effect rules, systems and methods disclosed herein can identify the additional items for the input for the new one of the cause and effect rules.

Figure 11:
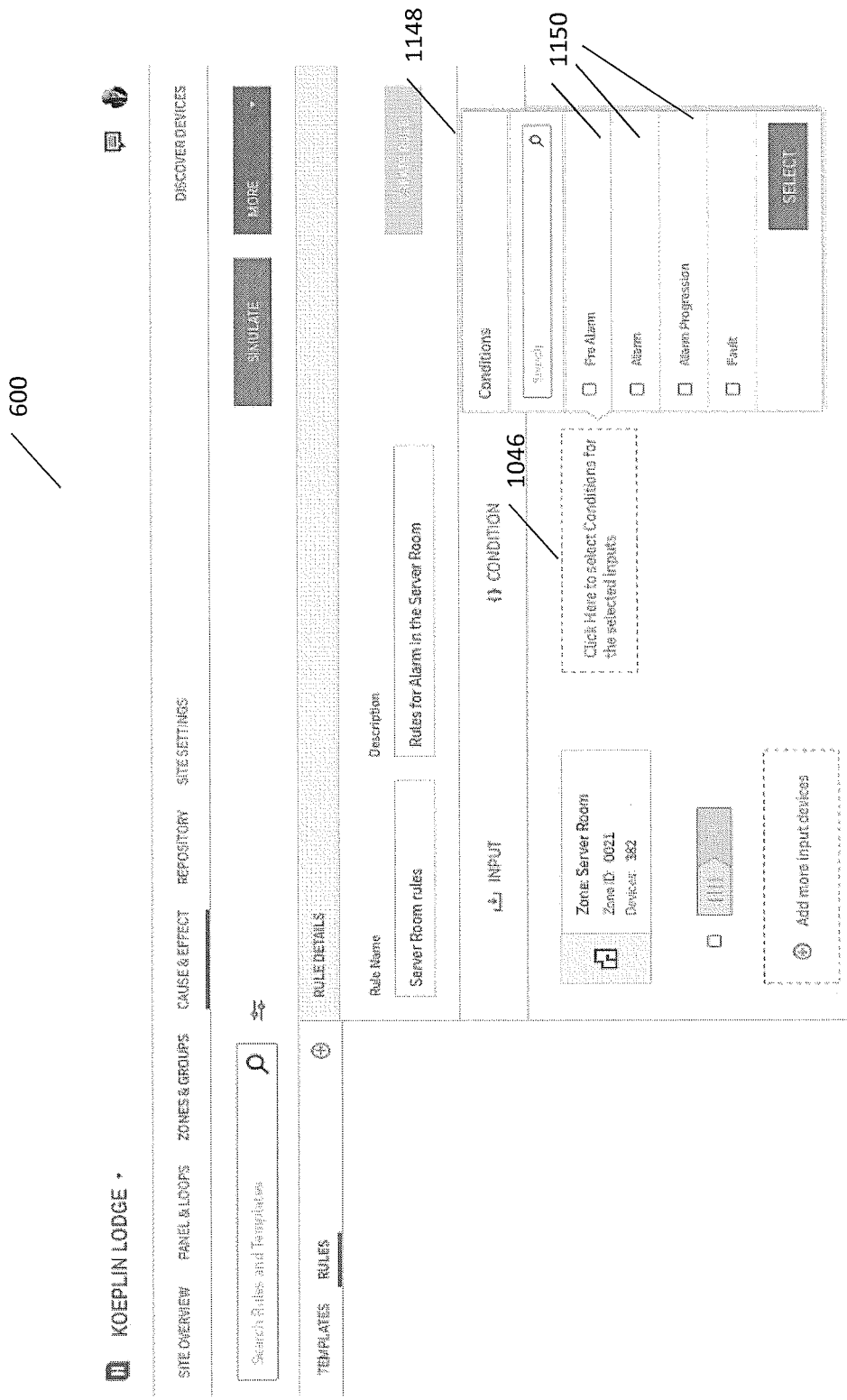
FIG. 11 is a graphical user interface displayed on a user terminal in accordance with disclosed embodiments.
Figure 12:
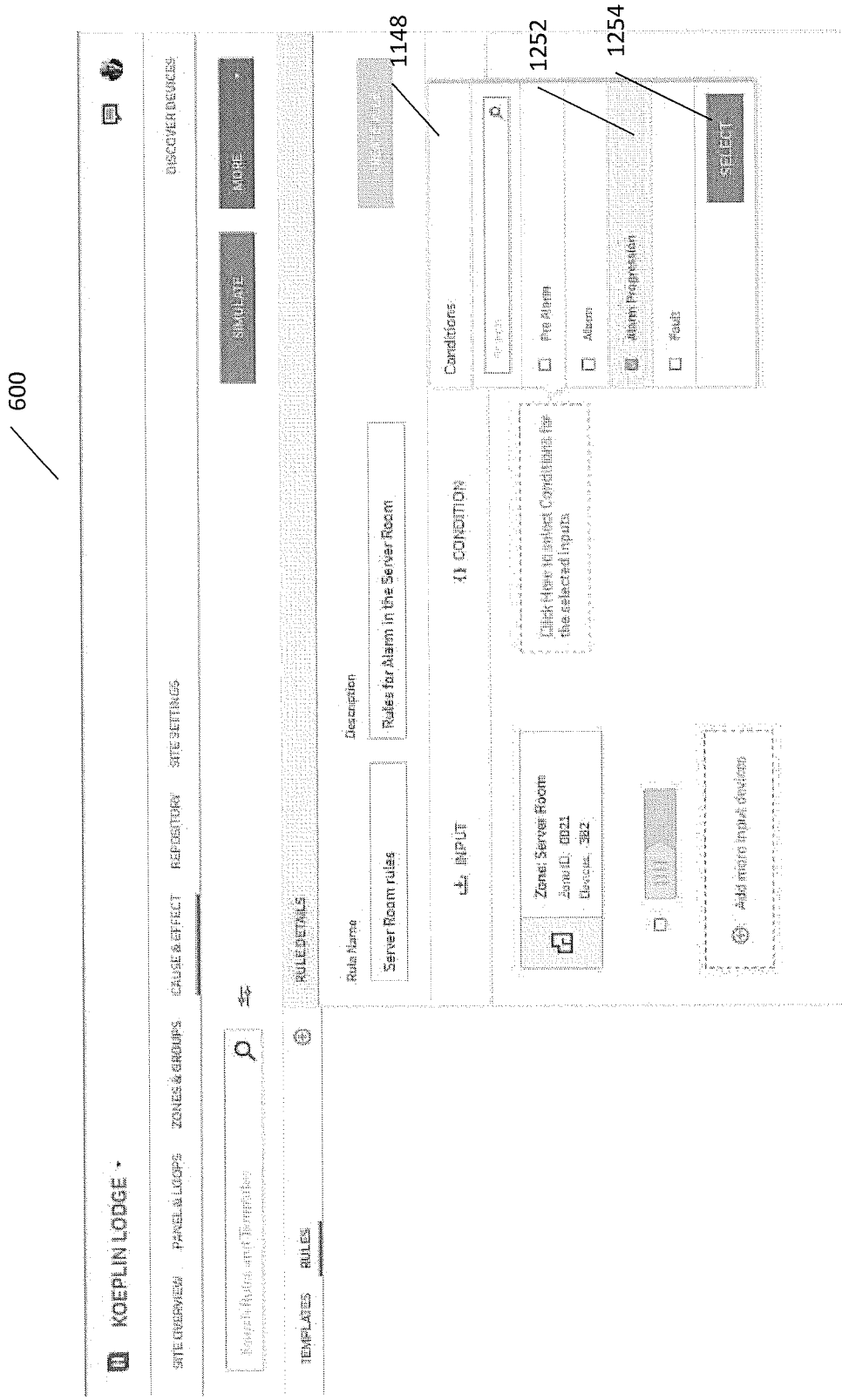
FIG. 12 is a graphical user interface displayed on a user terminal in accordance with disclosed embodiments.

Responsive to the GUI 600 receiving user input of the CE selecting the condition selection area 1046, the GUI 600 can display a condition selection pop-up window 1148 with a plurality of conditions 1150, a search bar, and a selection button 1254 displayed therein as seen in FIGS. 11 and 12. Responsive to the GUI 600 receiving user input of the CE selecting one or more of the plurality of conditions 1150, systems and methods disclosed herein can identify the plurality of conditions 1150 selected as conditions for the new one of the cause and effect rules. For example, the conditions can include any sensor detecting any alarm, any sensor detecting any pre-alarm, any sensor detecting any alarm progression, or any sensor detecting any fault. It is to be understood that systems and methods disclosed herein can identify more than one of the plurality of conditions 1150 as the conditions for the new one of the cause and effect rules.

Figure 13:
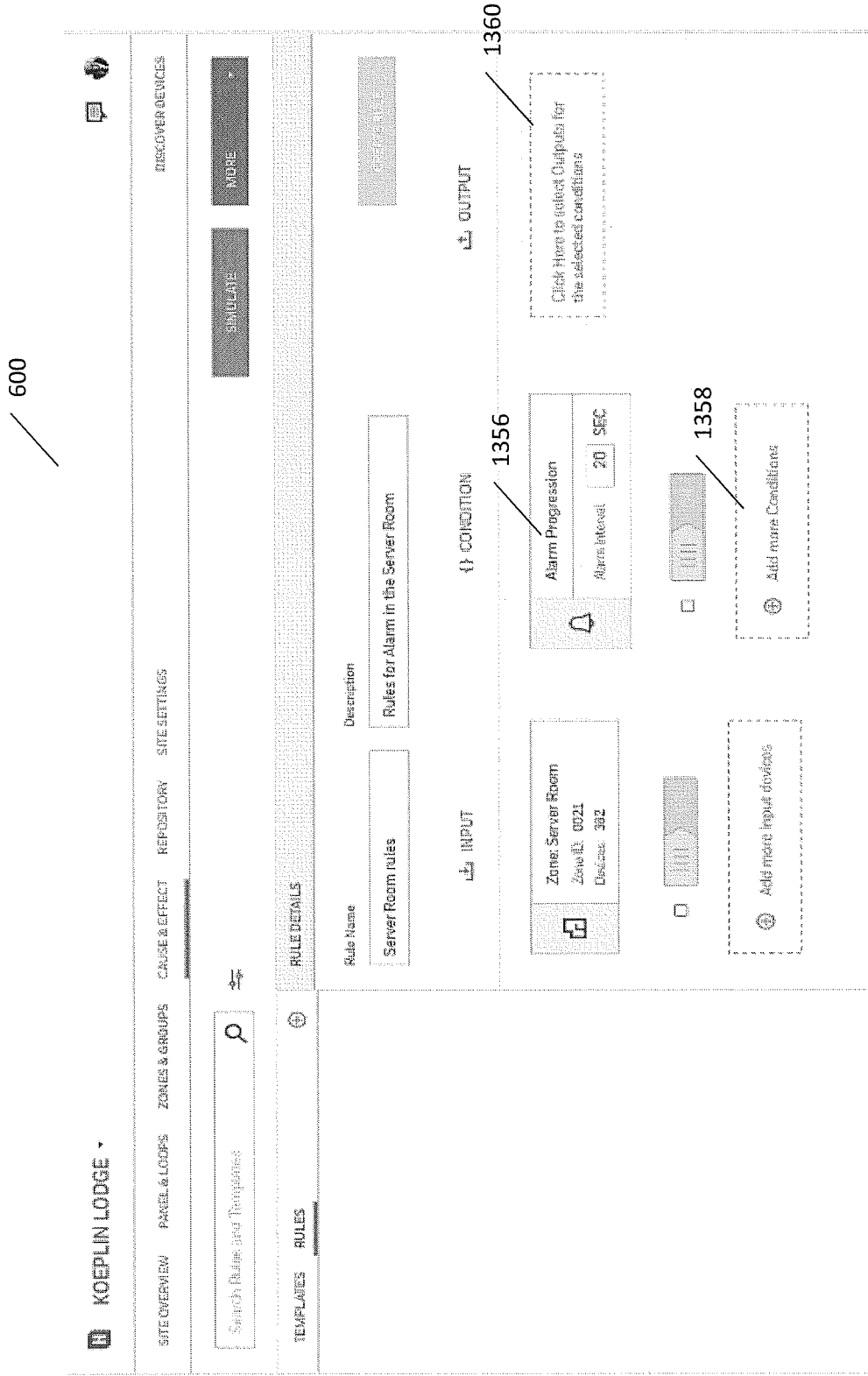
FIG. 13 is a graphical user interface displayed on a user terminal in accordance with disclosed embodiments.

Responsive to the GUI 600 receiving user input of the CE selecting any of the plurality of conditions 1150 (e.g. "Alarm Progression" 1252) and the selection button 1254, the GUI 600 can display a condition widget 1356, a condition selection area 1358, and an output selection area 1360 as seen in FIG. 13. The condition widget 1356 can display identifying information about the conditions selected for the new one of the cause and effect rules, such as a type of the conditions selected, an alarm interval time for the conditions selected, etc. Responsive to the GUI 600 receiving user input of the CE selecting the condition selection area 1358 and identifying additional items for the conditions selected from the new one of the cause and effect rules, systems and methods disclosed herein can identify the additional items for the conditions for the new one of the cause and effect rules.

Figure 14:
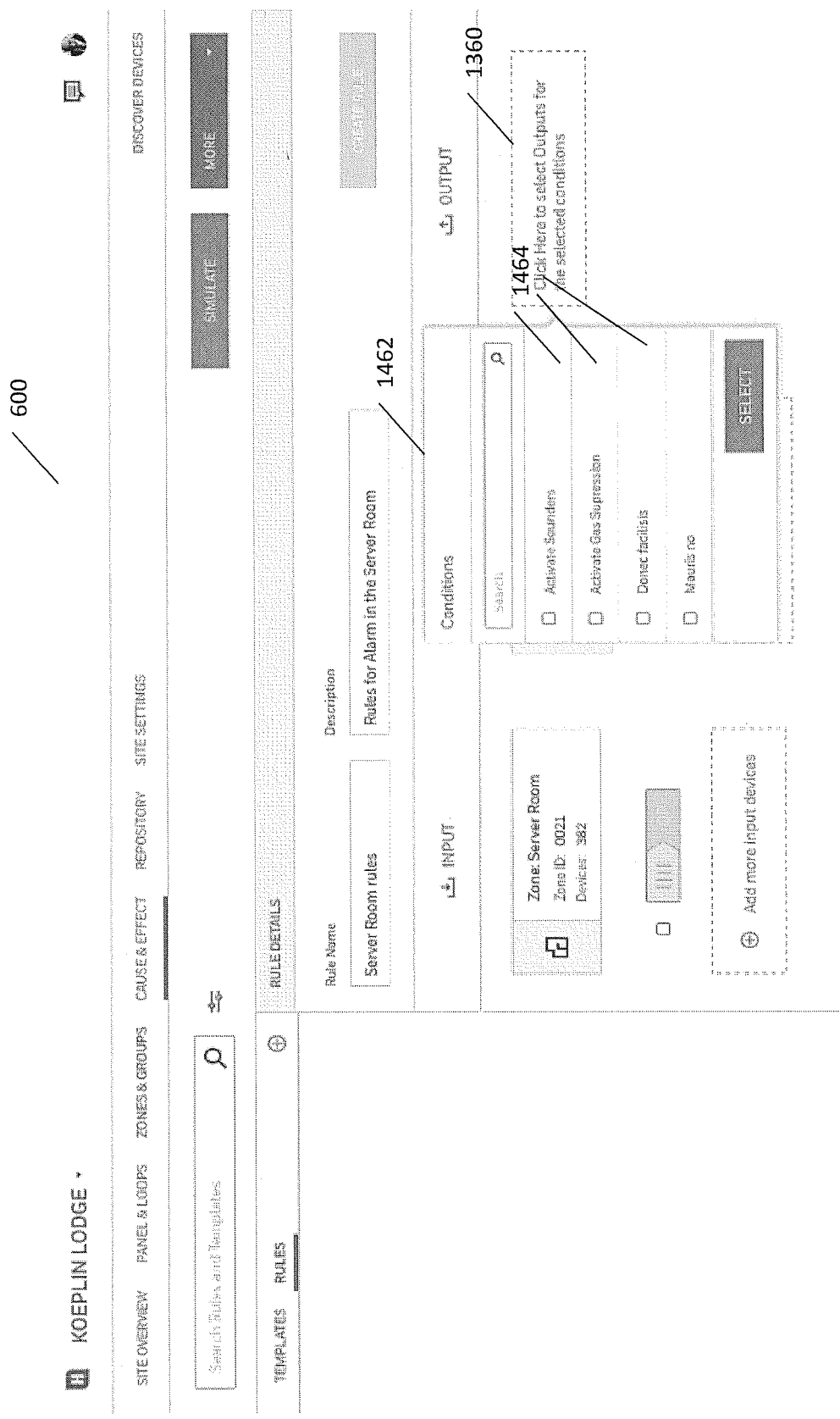
FIG. 14 is a graphical user interface displayed on a user terminal in accordance with disclosed embodiments.
Figure 15:
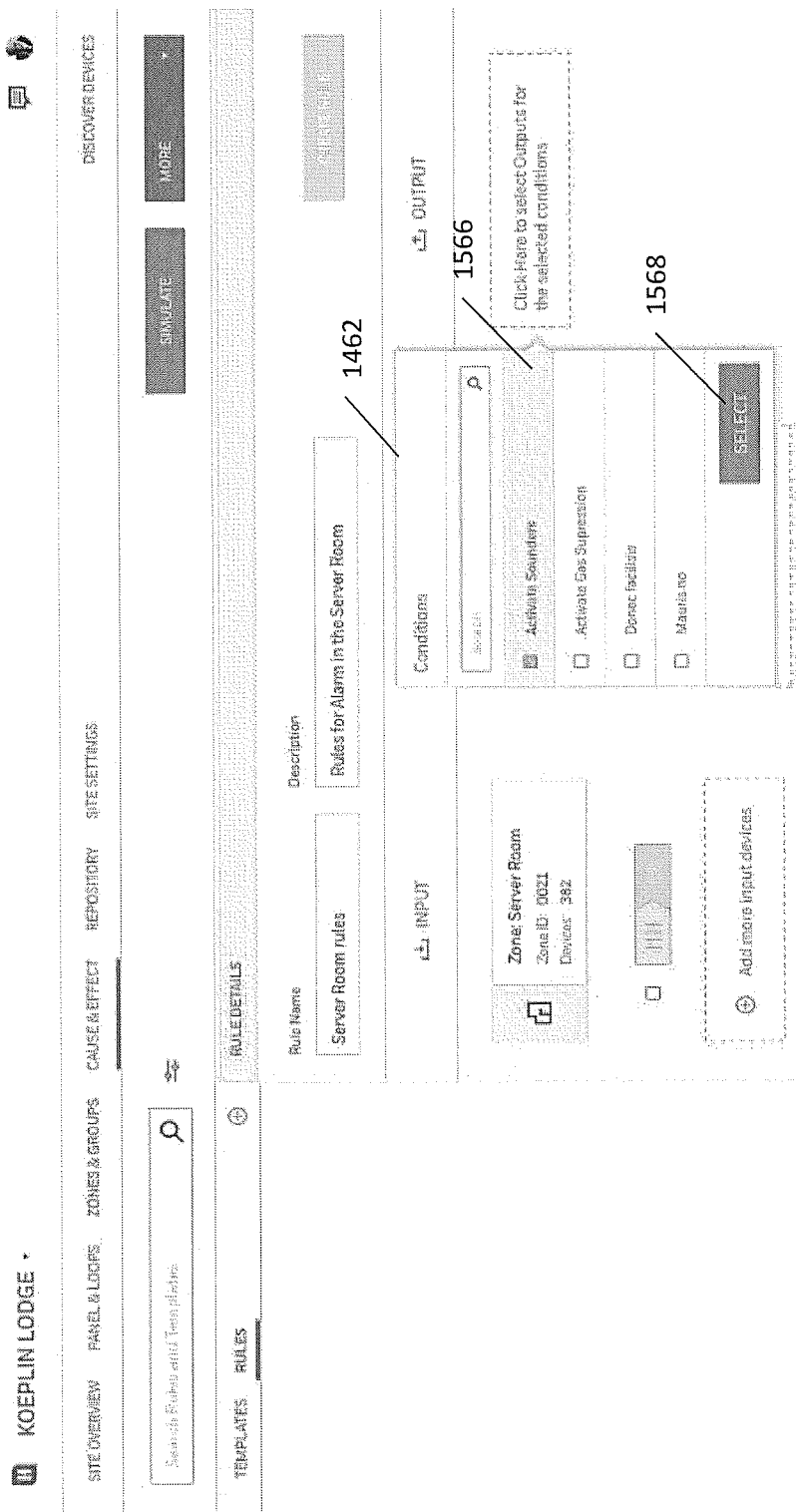
FIG. 15 is a graphical user interface displayed on a user terminal in accordance with disclosed embodiments.
Figure 16:
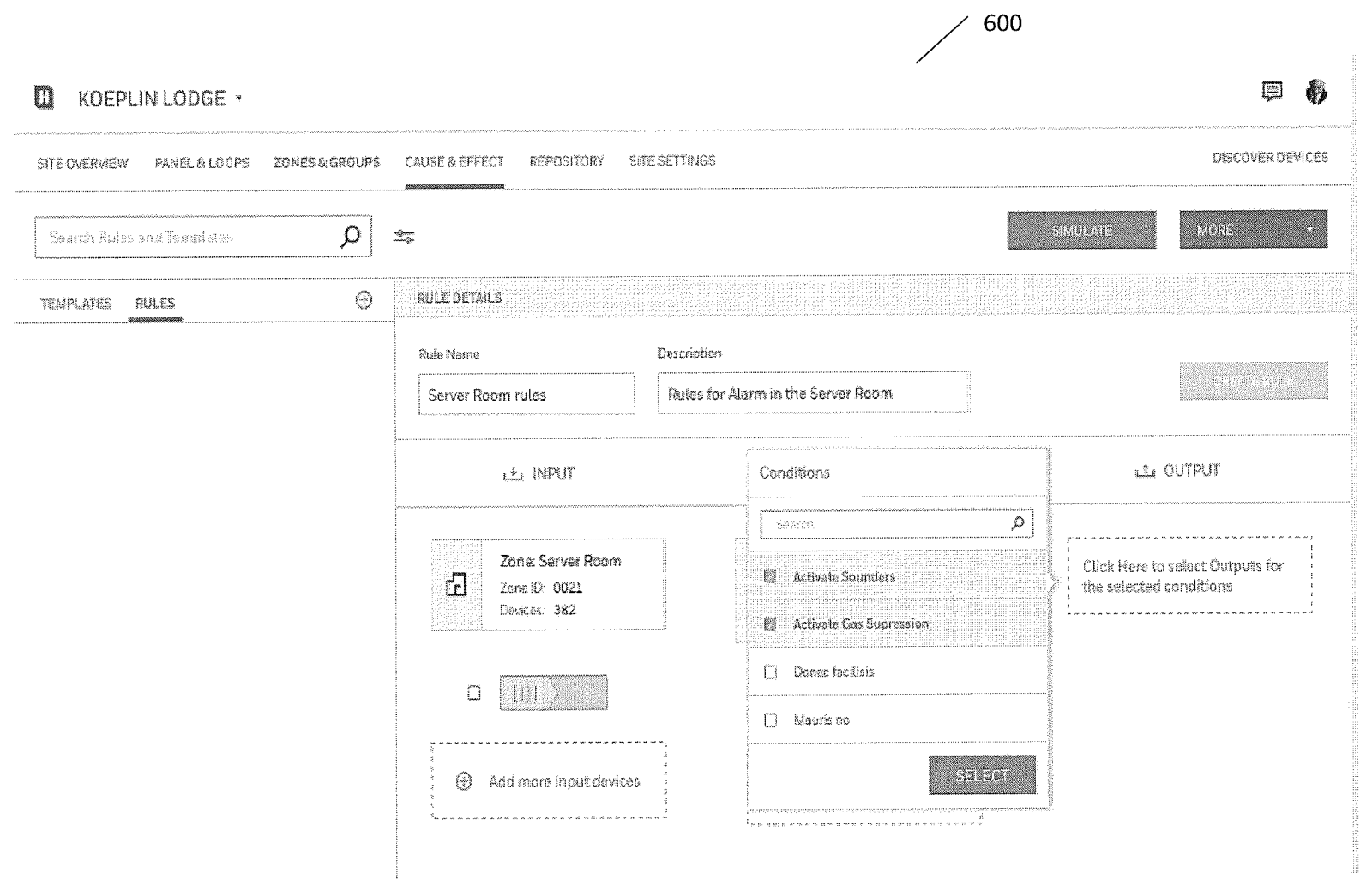

Responsive to the GUI 600 receiving user input of the CE selecting the output selection area 1360 to define output of the new one of the cause and effect rules, the GUI 600 can display an output selection pop-up window 1462 with a plurality of outputs 1464, a search bar, and a selection button 1568 displayed therein as seen in FIGS. 14-16. Responsive to the GUI 600 receiving user input of the CE selecting one or more of the plurality of outputs 1464 ("Activate Sounders" 1566), systems and methods disclosed herein can identify the plurality of outputs selected as the output for the new one of the cause and effect rules. For example, the output can include activating sounders, activating gas suppression, activating strobe lights, etc. It is to be understood that systems and methods disclosed herein can identify more than one of the plurality of outputs 1464 (e.g. "Activate Sounders" and "Activate Gas Suppression") to be the output for the new one of the cause and effect rules.

Figure 17:
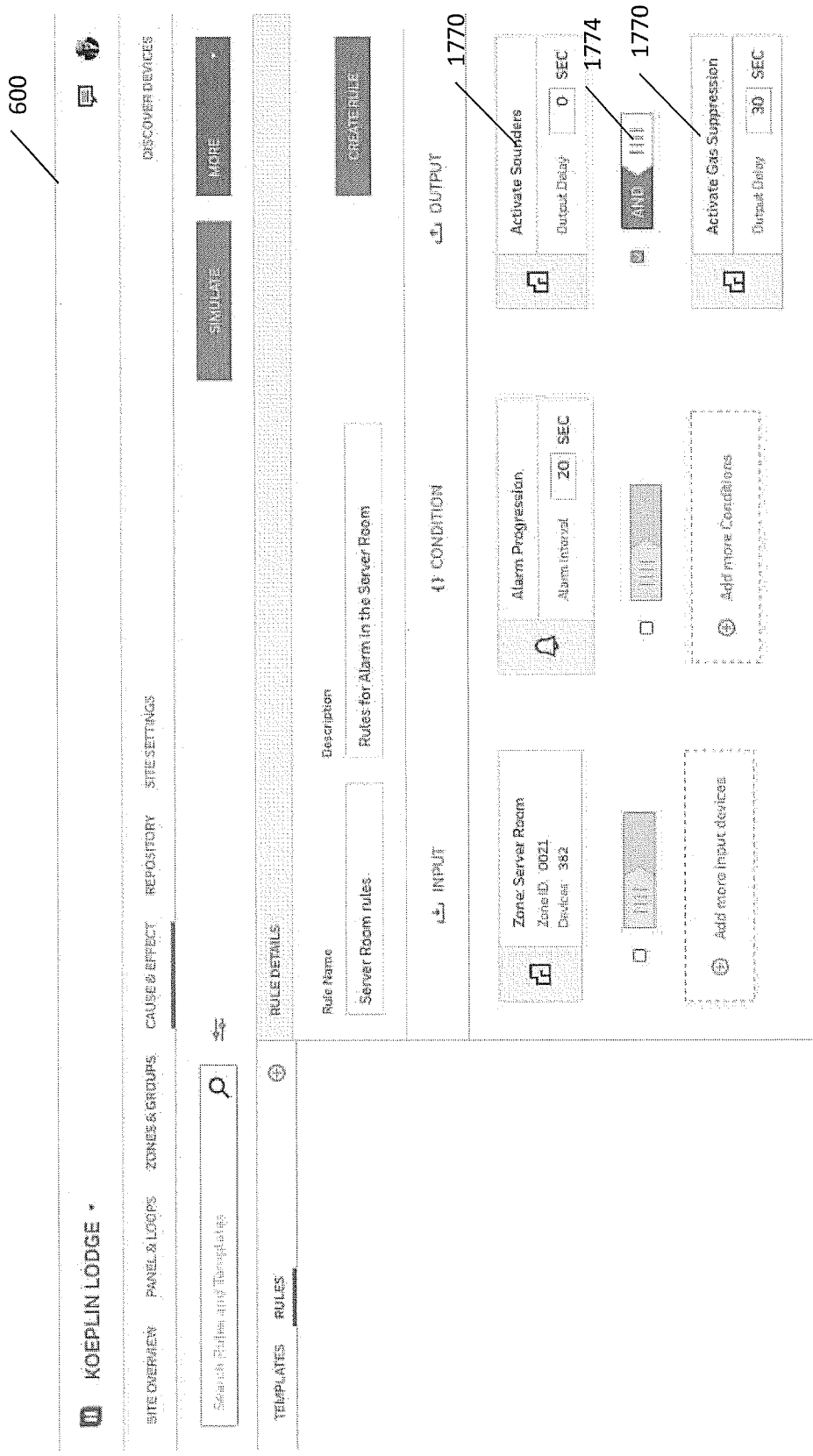
FIG. 17 is a graphical user interface displayed on a user terminal in accordance with disclosed embodiments.
Figure 18:
FIG. 18 is a graphical user interface displayed on a user terminal in accordance with disclosed embodiments.

Responsive to the GUI 600 receiving user input of the CE selecting the selection button 1568, the GUI 600 can display output widget(s) 1770 as seen in FIG. 17 and FIG. 18. It is to be understood that a number of the output widgets 1770 displayed can equal a number of the plurality of outputs 1464 identified for the new one of the cause and effect rules. The output widget(s) 1770 can display identifying information about the output identified for the new one of the cause and effect rules, such as a type of the output selected for the new one of the cause and effect rules, an output delay time for the output selected for the new one of the cause and effect rules, etc.

Furthermore, when more than one of the plurality of outputs 1464 is identified for the new one of the cause and effect rules, systems and methods disclosed herein can automatically activate and display a logical connection widget 1774 on the GUI 600. Responsive to the GUI 600 receiving user input of the CE setting the logical connection widget 1774 to "AND" as in FIG. 17 and the input and the conditions for the new one of the cause and effect rules being met, systems and methods disclosed herein can execute a logical AND on the output widget(s) 1770 displayed, thereby activating the output for all of the output widgets 1770 displayed. However, responsive to the GUI 600 receiving user input of the CE setting the logical connection widget 1774 to "OR" as in FIG. 18 and the input and the conditions for the new one of the cause and effect rules being met, systems and methods disclosed herein can execute a logical OR on the output widget(s) 1770 displayed.

After systems and methods disclosed herein identify the input, the conditions, and the output to define the new one of the cause and effect rules, the GUI 600 can display a create rule button 1876 for selection thereof. Responsive to the GUI 600 receiving user input of the CE selecting the create rule button 1876, systems and methods disclosed herein can save the new one of the cause and effect rules and display a successful rule creation banner 1978 as seen in FIG. 19 indicating that the new one of the cause and effect rules has successfully been created.

As explained above, the cause and effect rules can also be automatically defined. For example, in some embodiments, systems and methods disclosed herein can automatically define the cause and effect rules responsive to receiving user input of the CE identifying the plurality of zones 202 or retrieving an identification of the plurality of zones from the BIM file and responsive to receiving user input of the drawn evacuation routes.

After identifying the new one of the plurality of zones 202 responsive to the GUI 200 receiving user input and defining the metes and bounds of the new one of the plurality of zones 202 responsive to the GUI 300 and the GUI 400 receiving user input, systems and methods disclosed herein can display a GUI 2000 that includes a list of the plurality of zones 202 created, the floor plan 310, and a draw evacuation route button 2080 as seen in FIG. 20. Responsive to the GUI 2000 receiving user input of the CE selecting the draw evacuation route button 2080, the GUI 200 can receive user input of the CE drawing or otherwise identifying an evacuation route 2082 on the floor plan 310.

For example, as seen in FIG. 20, the evacuation route 2082 can start from a first of the plurality of zones 202 displayed on the floor plan 310 and can end at an emergency exit 2084 displayed on the floor plan 310. In some embodiments, the evacuation route 2082 can include a direction parameter to the emergency exit 2084, and in some embodiments, systems and methods disclosed herein can use coordinate data from the BIM file to identify a distance from the first of the plurality of zones 202 to the emergency exit 2084.

Additionally or alternatively, after identifying the new one of the plurality of zones 202 responsive to the GUI 200 receiving user input and identifying the metes and bounds of the new one of the plurality of zones 202 via the GUI 300 and the GUI 400 receiving user input, systems and methods disclosed herein can display a GUI 2100 that includes a grid view of the BIM file. For example, in some embodiments, the grid view may omit floor plan details, such as wall and door locations, and only display the plurality of zones 202.

As seen in FIG. 21, exemplary evacuation routes 2188, 2192 can extend through, that is, touch, or abut one or more of the plurality of zones 202. For example, in the grid view 2186 of a ground floor, one of the evacuation routes 2188 can begin in zone 007 and extend through zones 010, 004, and 008. Accordingly, systems and methods disclosed herein can identify the one of the evacuation routes 2188 as applying to zones 010, 004, and 008 and can display a notification on the GUI 2100 indicating that zones 005 and 006 are not associated with any of the evacuation routes. As another example, in the grid view 2190 of a first floor, one of the evacuation routes 2192 can begin in zone 010 and extend through zones 010, 004, and 008. Accordingly, systems and methods disclosed herein can identify the one of the evacuation routes 2192 as applying to zones 005, 006, and 007.

Responsive to receiving user input of the CE identifying the evacuation routes, systems and methods disclosed herein can automatically define the cause and effect rules as disclosed herein, and in some embodiments, the GUI 2100 can display the cause and effect rules a cause and effect rule area 2194.

Figure 22:
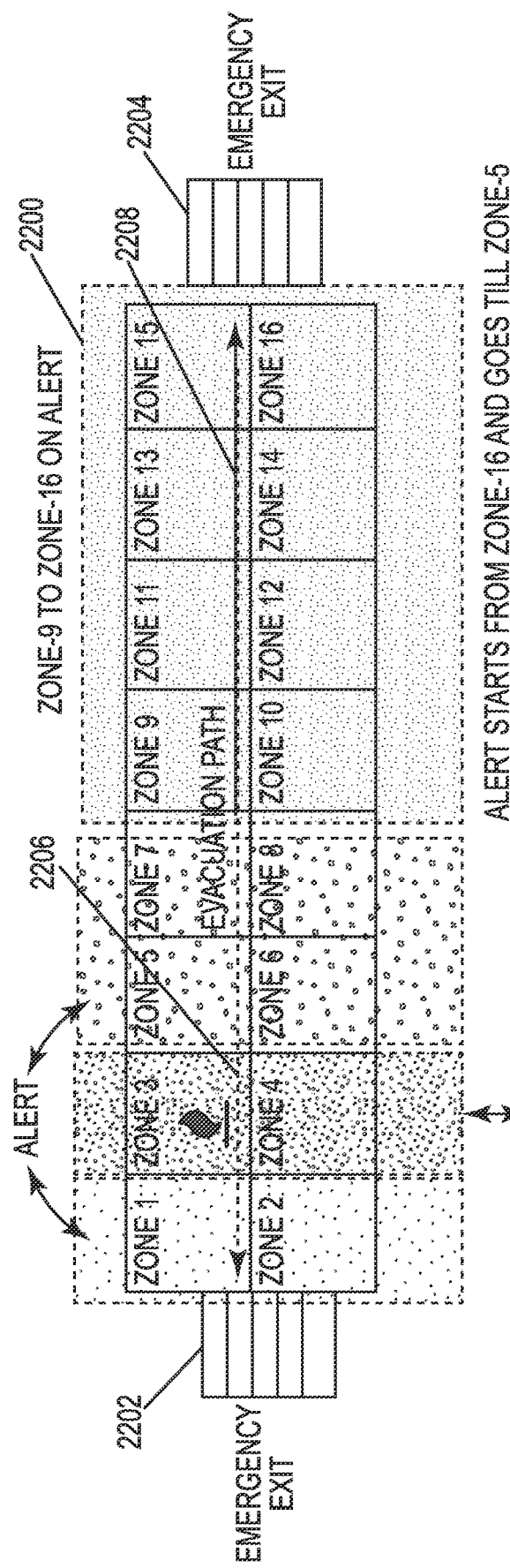
FIG. 22 is a floor plan with a plurality of zones in accordance with disclosed embodiments.

FIG. 22 is an exemplary floor plan 2200 of zones in a secured area and can be used to illustrate systems and methods disclosed herein automatically defining the cause and effect rules. As seen in FIG. 22, the floor plan 2200 can include sixteen zones (zone 1-zone 16) and two emergency exits 2202, 2204. Any GUI displaying the floor plan 2200 can receive user input of the CE drawing or otherwise identifying two evacuation routes 2206, 2208. As seen, zones 1-8 can follow a first of the evacuation routes 2206 to a first of the emergency exits 2202, and zones 9-16 can follow a second of the evacuation routes 2208 to a second of the emergency exits 2204.

Responsive to receiving user input of the CE drawing or otherwise identifying the evacuation routes 2206, 2008, systems and methods disclosed herein can identify a respective distance factor from each of the zones to an assigned one of the emergency exits 2202, 2204 based on an assigned one of the evacuation routes 2206, 2008 for a respective one of the plurality of zones. For example, the respective distance factor from zone 1 to the first of the emergency exits 2202 can be one because one of the zones stands between zone 1 and the first of the emergency exits 2202 (e.g. zone 1). Similarly, the respective distance factor from zone 8 to the first of the emergency exits 2202 can be four because four of the zones stand between zone 8 and the first of the emergency exits 2202 (e.g. zones 2, 4, 6, and 8). As an alternative example, the respective distance factor from zone 16 to the second of the emergency exits 2204 can be one because one of the zones stands between zone 16 and the second of the emergency exits 2204 (e.g. zone 16). However, if zone 16 been assigned an evacuation route that ended at the first of the emergency exits 2202, then the respective distance factor from zone 16 to the first of the emergency exits 2202 would have been eight because eight of the zones stand between zone 16 and the first of the emergency exits 2202 (e.g. zones 2, 4, 6, 8, 10, 12, 14, 16).

While the respective distance factor from each of the zones to the assigned one of the emergency exits 2202, 2204 are shown in integer form for illustration purposes, systems and methods disclosed herein can also use the BIM coordinates to identify the respective distance factor from each of the zones to the assigned one of the emergency exits 2202, 2204 in actual distance form, such as a respective straight line distance (e.g. "as the crow flies") or a respective distance traveled via the assigned one of the evacuation routes 2206, 2008.

In any embodiment, systems and methods disclosed herein can store the respective distance factor from each of the zones to the assigned one of the emergency exits 2202, 2204 in a table in the memory device. In this regard, FIG. 23 is a table 2300 of zone distance factors for from the zones to the assigned emergency exits 2202, 2204 in the floor plan 2200 of FIG. 22.

As seen in FIG. 22, systems and methods disclosed herein can receive user input of the CE identifying an emergency event (simulated or real) in one or more of the zones, for example, in zones 3 and 4, thereby making zones 3 and 4 emergency ones of the zones. Responsive to identifying the emergency event, systems and methods disclosed herein can identify a respective relative distance from each of the zones to the emergency ones of the zones. For example, systems and methods disclosed herein can identify the respective relative distance from each of the emergency ones of the zones, zones 3 and 4, to be zero. However, systems and methods disclosed herein can identify the respective relative distance from each of zones 1, 2, 5, and 6 to the emergency ones of the zones to be one because each of zones 1, 2, 5, and 6 is immediately adjacent to the emergency ones of the zones.

In this regard, FIG. 24 is a table 2400 of alert sequence factors for the zones in the floor plan 2200 of FIG. 22. As seen, the third column of the table 2400 identifies the respective distance factor from each of the zones to the assigned one of the emergency exits 2202, 2204, and the fourth column of the table 2400 identifies the respective relative distance from each of the zones to the emergency ones of the zones, zones 3 and 4. In some embodiments, systems and methods disclosed herein can identify the respective distance factor from each of the zones to the assigned one of the emergency exits 2202, 2204 and the respective relative distance from each of the zones to the emergency ones of the zones prior to or during simulation of the emergency event.

Then, systems and methods disclosed herein can multiply the respective distance factor by the respective relative distance for each of the zones to identify a respective alert sequence factor, which is identified in the fifth column of the table 2400. Finally, systems and methods disclosed herein can automatically define the cause and effect rules based on the respective alert sequence factor for each of the zones.

For example, the cause and effect rules can generate an alarm notification in any zones in which the emergency event is detected (e.g. alert sequence factor=0) and can generate alert evacuation notifications in descending order from a highest alert sequence factor for each of the zones assigned to the one of the emergency exits 2202 to which the zones in which the emergency events are detected are assigned to a lowest, non-zero alert sequence factor for each of the zones assigned to the one of the emergency exits 2202 to which the zones in which the emergency events are detected are assigned. That is, systems and methods disclosed herein can first generate one of the alert evacuation notifications in zones 7 and 8 because, like zones 3 and 4, zones 7 and 8 are assigned to the first one of the emergency exits 2202 and have the highest alert sequence factor for each of the zones assigned to the first one of the emergency exits 2202. Indeed, zones 7 and 8 have the highest alert sequence factor for each of the zones assigned to the first one of the emergency exits 2202 because, of those zones, zones 7 and 8 are located furthest from the first of the emergency exits 2202 and, therefore, require the most time for evacuation therefrom. Next, systems and methods disclosed herein can generate one of the alert evacuation notifications in zones 5 and 6 because, like zones 3 and 4, zones 5 and 6 are assigned to the first one of the emergency exits 2202 and have a next highest alert sequence factor for each of the zones assigned to the first one of the emergency exits 2202. Indeed, after zones 7 and 8, zones 5 and 6 have the next highest alert sequence factor for each of the zones assigned to the first one of the emergency exits 2202 because, of those zones, zones 5 and 6 are located the next furthest from the first of the emergency exits 2202. Finally, systems and methods disclosed herein can generate one of the alert evacuation notifications in zones 1 and 2 because, like zones 3 and 4, zones 1 and 2 are assigned to the first one of the emergency exits 2202 and have the lowest, non-zero alert sequence for each of the zones assigned to the first one of the emergency exits. Indeed, zones 1 and 2 have the lowest, non-zero alert sequence factor for each of the zones assigned to the first one of the emergency exits 2202 because, of those zones, zones 1 and 2 are located the closest to the first of the emergency exits 2202. In some embodiments, systems and methods disclosed herein can implement a delay (e.g. 30 seconds) between alerting each of the zones.

As seen in FIG. 22, zones 9-16 can be assigned to the second of the emergency exits 2204. However, when the emergency event is detected in any of the zones assigned to the first of the emergency exits 2202, systems and methods disclosed herein executing the cause and effect rules can generate alert information notifications in each of the zones assigned to the second of the emergency exits 2202, zones 9-16.

In some embodiments, the cause and effect rules can include time delays. Accordingly, systems and methods disclosed herein can separate the alarm notification, the alert evacuation notifications, and the alert information notifications in time and/or delay the alarm notifications, the alert evacuation notifications, and the alert information notifications. For example, systems and methods disclosed herein can activate the alarm notification immediately after identifying the emergency event in the emergency ones of the zones. Then, systems and methods disclosed herein can activate a first of the alert evacuation notifications a predetermined period of time after the alarm notification, activate a second of the alert evacuation notifications the predetermined period of time after the first of the alerts, activate a third of the alert evacuation notifications the predetermined period of time after the second of the alerts, and activate the alert information notifications the predetermined period of time after the third of the alert evacuation notifications.

It is to be understood that systems and methods disclosed herein can automatically define the cause and effect rules for any and all of the zones in which the emergency event is identified.

Figure 25:
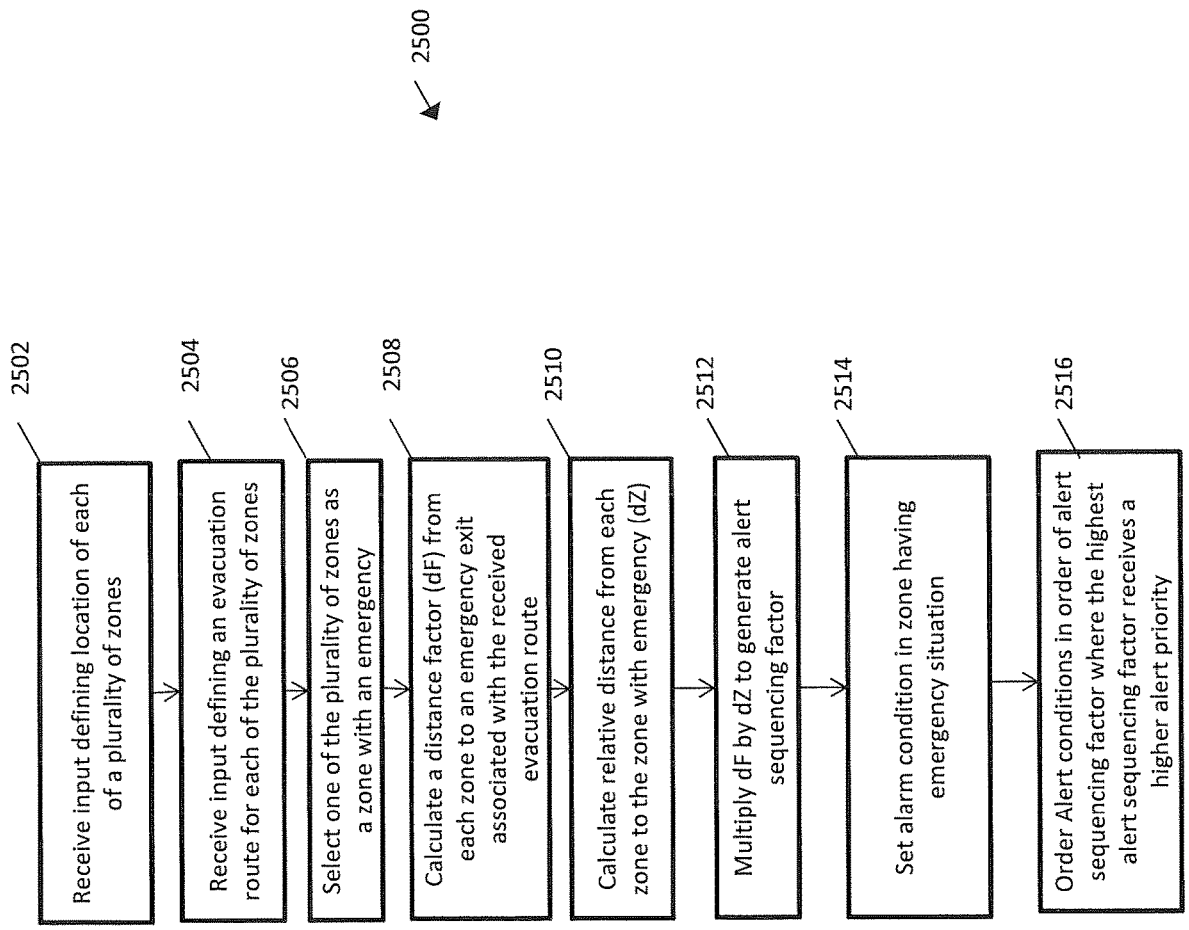
FIG. 25 is a flow diagram of a method in accordance with disclosed embodiments.

FIG. 25 is flow diagram of a method 2500 in accordance with disclosed embodiments. As seen in FIG. 25, the method

2500 can include a processor (e.g. the programmable processor 32) receiving input defining and identifying a respective location of each of a plurality of zones in a secured area as in 2502 and the processor receiving input identifying a respective evacuation route from each of the plurality of zones as in 2504. For example, the processor can receive the input defining and identifying the respective location of each of the plurality of zones and the input identifying the respective evacuation route from each of the plurality of zones via user input entered into a floor plan displayed on a GUI.

Then, the method 2500 can include the processor identifying an emergency event in one of the plurality of zones as in 2506, the processor identifying a respective distance factor from each of the plurality of zones to an emergency exit based on the respective evacuation route from a respective one of the plurality of zones as in 2508, the processor identifying a respective relative distance from each of the plurality of zones to the one of the plurality of zones in which the emergency event is identified as in 2510, and the processor identifying a respective alert sequence factor for each of the plurality of zones by multiplying the respective distance factor by the respective relative distance for each of the plurality of zones as in 2512. The respective alert sequence factor for each of the plurality of zones can be ordered highest to lowest, and the method 2500 can include the processor generating an alarm notification in the one of the plurality of zones in which the emergency event is identified as in 2514 and, for remaining ones of the plurality of zones, the processor generating alert notifications in an order corresponding to the respective alert sequence factor for the remaining ones of the plurality of zones such that one of the remaining ones of the plurality of zones with a highest alert sequence factor can receive one of the alert notifications before one of the remaining ones of the plurality of zones with a lowest alert sequence factor receives one of the alert notifications.

Figure 26:
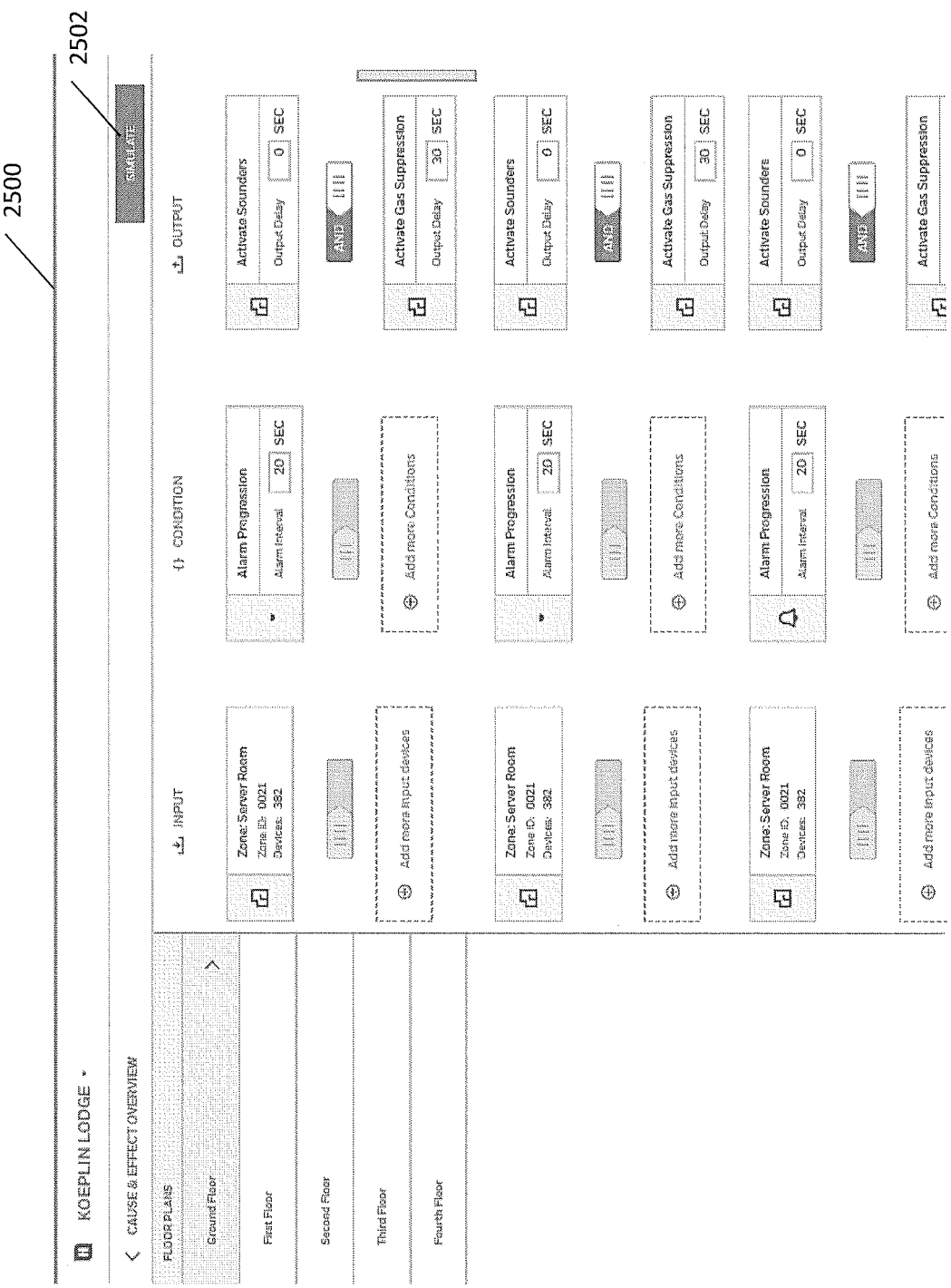
FIG. 26 is a graphical user interface displayed on a user terminal in accordance with disclosed embodiments.

After automatically defining the cause and effect rules, systems and methods disclosed herein may display a GUI 2500 identifying all of the cause and effect rules defined as seen in in FIG. 26. As seen, the cause and effect rules in FIG. 26 can be displayed as widgets, which can be customized pursuant to received user input.

As seen in FIG. 26, the GUI 2500 can also display a simulate button 2502, and responsive to the GUI 2500 receiving user input of the CE selecting the simulate button 2502, systems and methods disclosed herein can simulate the cause and effect rules. For example, in some embodiments, systems and methods disclosed herein can graphically simulate the cause and effect rules by displaying a GUI 2700 as seen in FIG. 27.

As seen, the GUI 2700 can include a map or floor plan 2702 that can be displayed in different colors. For example, systems and methods disclosed herein can display any of the plurality of zones in the floor plan 2702 in a non-white color when systems and methods disclosed herein activate the alarm notification or one of the alert notifications therein. In some embodiments, systems and methods disclosed herein can display any of the plurality of zones in the floor plan 2702 in a first color when systems and methods disclosed herein activate the alarm notification therein and can display any of the plurality of zones in a second, different color when systems and methods disclosed herein activate one of the alert notifications therein. In some embodiments, systems and methods disclosed herein can also display a speaker icon any of the plurality of zones when systems and methods disclosed herein activate the alarm notification therein to represent sounders being activated therein. In some embodiments, during the simulation, any of the plurality of zones can change color or flash color in real-time to correspond with the output of the cause and effect rules.

Figure 27:
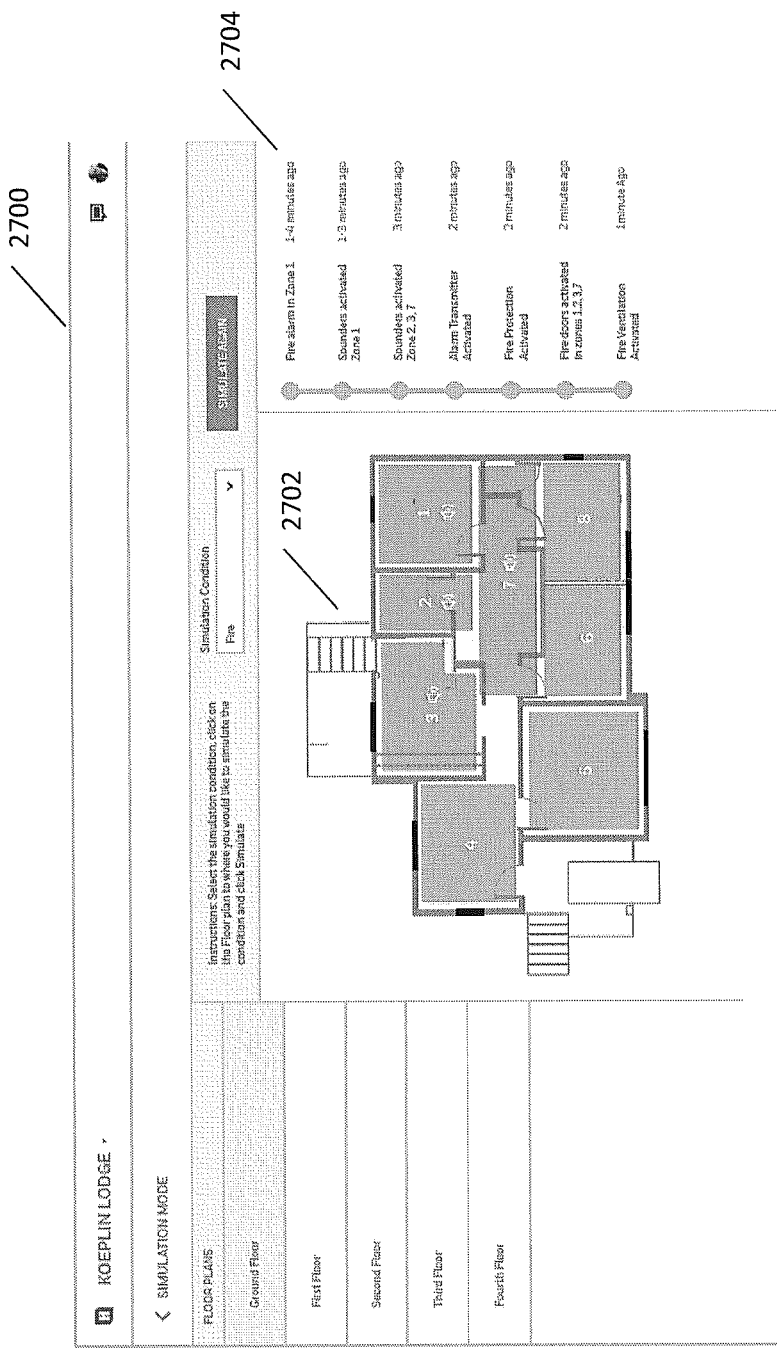
FIG. 27 is a graphical user interface displayed on a user terminal in accordance with disclosed embodiments.

As seen in FIG. 27, the GUI 2700 can also display cause and effect outputs in a simulation list 2704, and in some embodiments, during the simulation, items in the simulation list 2704 can be added thereto for display on the GUI 2700 in real-time to correspond with the output of the cause and effect rules.

It is to be understood that systems and methods disclosed herein can execute a plurality of simulations to simulate a plurality of identified events, such as a fire, carbon monoxide, a burglary, etc., such that each of the plurality of identified events can originate from a respective one of the plurality of zones. In some embodiments, the plurality of simulations can be displayed on a per floor basis.

Figure 28:
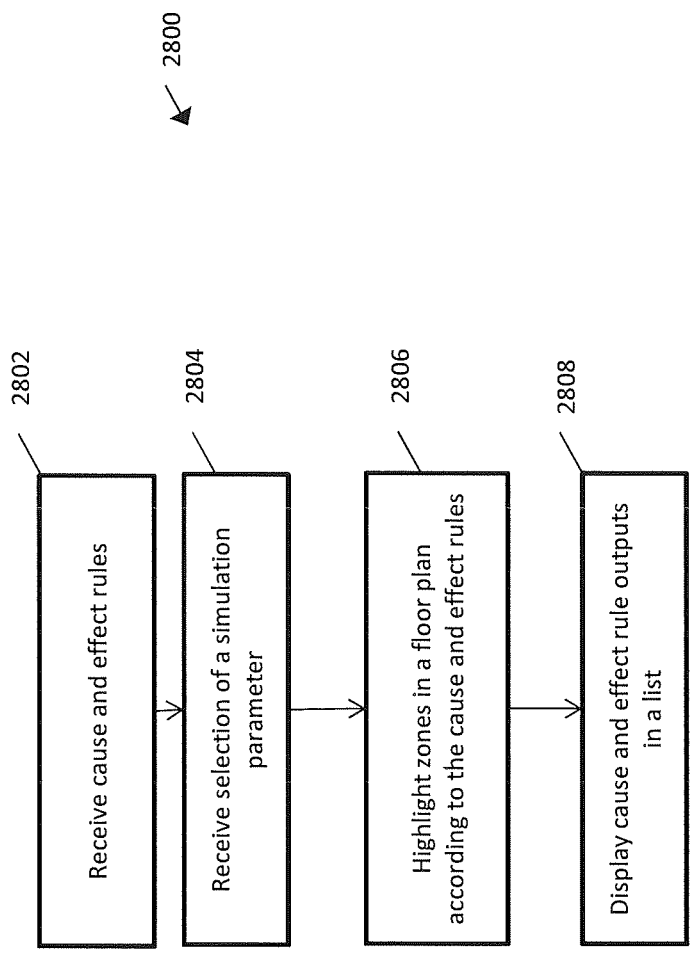
FIG. 28 is a flow diagram of a method in accordance with disclosed embodiments.

FIG. 28 is flow diagram of a method 2800 in accordance with disclosed embodiments. As seen in FIG. 28, the method 2800 can include a processor (e.g. the programmable processor 32) receiving cause and effect rules as in 2802, and the processor receiving user input selecting at least one simulation parameter (e.g. an identified event), such as a fire event, a carbon monoxide event, a burglary event, or any other emergency event, as in 2804. As disclosed herein, the processor can receive the cause and effect rules from user input manually entering the cause and effect rules into a GUI or from an automatic generation of the cause and effect rules responsive to user input. Then, the method 2800 can include the processor highlighting or flashing a plurality of zones in a floor plan displayed on a GUI with color in accordance with the cause and effect rules as in 2806 and the processor displaying cause and effect rule outputs in a list on the GUI as in 2808. In some embodiments, the processor can highlight or flash the plurality of zones with the color and add the cause and effect rule outputs to the list in real-time to correspond with the output of the cause and effect rules, including, for example, a delay time identified in the cause and effect rules.

Although a few embodiments have been described in detail above, other modifications are possible. For example, the logic flows described above do not require the particular order described or sequential order to achieve desirable results. Other steps may be provided, steps may be eliminated from the described flows, and other components may be added to or removed from the described systems. Other embodiments may be within the scope of the invention.

From the foregoing, it will be observed that numerous variations and modifications may be effected without departing from the spirit and scope of the invention. It is to be understood that no limitation with respect to the specific system or method described herein is intended or should be inferred. It is, of course, intended to cover all such modifications as fall within the spirit and scope of the invention.

What is claimed is:

1. A method comprising:
providing a security system that protects a secured area of an interior space within a building, the secured area divided into a plurality of physical zones, each zone, of the plurality of physical zones, defined by a boundary created on a floor plan by a user;
initiating a test of the security system by initiating a simulated user input identifying an emergency event in one of the plurality of physical zones of the secured area;
responsive to the simulated user input, simulating an emergency response process;

during simulation, displaying on a graphical user interface a first indicator that identifies a first output regarding instructions provided to occupants within a first physical zone of the plurality of zones;

during the simulation, displaying on the graphical user interface a second indicator that identifies a second output regarding instructions provided to occupants within a second physical zone of the plurality of zones;

during the simulation, displaying a simulation list of items that can be added to the emergency response process for an input of a cause and effect rule and, during the simulation, selecting an item from the simulation list of items that can be added to the emergency response process and adding the selected item to a future simulated emergency response process; and overlaying and displaying the first indicator and the second indicator on a floor plan of the secured area displayed on the graphical user interface.

2. The method of claim 1, wherein during simulation, displaying on the graphical user interface includes the first indicator that identifies the first output of a first of a plurality of cause and effect rules within the first of the plurality of zones; and during the simulation, displaying on the graphical user interface includes a second indicator that identifies a second output of a second of the plurality of cause and effect rules within a second of the plurality of zones.

3. The method of claim 1, further comprising:
wherein the first indicator includes changing a color of the first of the plurality of zones on the floor plan displayed on the graphical user interface.

4. The method of claim 3, further comprising:
flashing the color of the first of the plurality of zones on the floor plan displayed on the graphical user interface.

5. The method of claim 1, further comprising:
wherein the first indicator indicates an alarm or alert condition within a zone of the secured area.

6. The method of claim 1, further comprising:
during the simulation, selecting an item from the simulation list of items that can be added to the emergency response process and adding the item in real-time to the simulated emergency response process.

7. The method of claim 1, further comprising:
determining, based on the emergency response process being simulated, an evacuation route for occupants of a specific zone within the secured area; and
displaying the route on the floor plan of the secured area displayed on the graphical user interface.

8. The method of claim 7, further comprising:
determining, based on the emergency response process being simulated, multiple evacuation routes for occupants of a specific zone within the secured area;
determining a best evacuation route from the multiple evacuation routes, based on at least one factor stored in memory and displaying the best evacuation route on the floor plan of the secured area displayed on the graphical user interface.

9. A user interface device, comprising:
a programmable processor; and
executable control software stored on a non-transitory computer readable medium, wherein the control software is executable to:
provide a security system that protects a secured area of an interior space within a building, the secured area divided into a plurality of physical zones, each zone, of the plurality of physical zones, defined by a boundary created on a floor plan by a user;

initiating a test of the security system by initiating a simulated user input identifying an emergency event in one of the plurality of physical zones of the secured area;

responsive to the simulated user input, simulate an emergency response process;

during simulation, display on a graphical user interface of the user interface device a first indicator that identifies a first output regarding instructions provided to occupants within a first physical zone of the plurality of zones;

during the simulation, display on the graphical user interface a second indicator that identifies a second output regarding instructions provided to occupants within a second physical zone of the plurality of zones;

during the simulation, displaying a simulation list of items that can be added to the emergency response process for an input of a cause and effect rule and, during the simulation, selecting an item from the simulation list of items that can be added to the emergency response process and adding the selected item to a future simulated emergency response process; and overlay and display the first indicator and the second indicator on a floor plan of the secured area displayed on the graphical user interface.

10. The device of claim 9, wherein the programmable processor executes the executable control software to identify a respective distance factor from each of the plurality of zones to an emergency exit based on a respective evacuation route from each respective one of the plurality of zones.

11. The device of claim 9, wherein the programmable processor executes the executable control software to identify a respective relative distance from each of the plurality of zones to the one of the plurality of zones in which an emergency event is identified.

12. The device of claim 11, wherein the programmable processor executes the executable control software to identify a respective alert sequence factor for each of the plurality of zones by multiplying a respective distance factor by the respective relative distance for each of the plurality of zones and, for remaining ones of the plurality of zones, the programmable processor generating alert notifications in an order corresponding to the respective alert sequence factor for the remaining ones of the plurality of zones such that one of the remaining ones of the plurality of zones with a highest alert sequence factor can receive one of the alert notifications before one of the remaining ones of the plurality of zones with a lowest alert sequence factor receives one of the alert notifications.

13. The device of claim 12, wherein the programmable processor executes the executable control software to order the respective alert sequence factor for each of the plurality of zones from highest to lowest.

14. The device of claim 9, wherein, during the simulation the programmable processor executes the executable control software to generate an alarm notification in the one of the plurality of zones in which the emergency event is identified.

15. The device of claim 14, wherein the programmable processor executes the executable control software to: for remaining ones of the plurality of zones, the programmable processor generates alert notifications in an order corresponding to the respective alert sequence factor for the remaining ones of the plurality of zones such that one of the remaining ones of the plurality of zones with a highest alert sequence factor can receive one of the alert notifications before one of the remaining ones of the plurality of zones with a lowest alert sequence factor receives one of the alert notifications.

16. The device of claim 9, wherein the programmable processor executes the executable control software to display the first indicator and the second indicator in real-time to correspond to activation times of an output of a first of a plurality of cause and effect rules and an output of a second of a plurality of cause and effect rules.

17. A system, comprising:
a number of security system devices including:
a user interface device having a programmable processor; and
executable control software stored on a non-transitory computer readable medium, wherein the control software is executable to:
provide a security system that protects a secured area of an interior space within a building, the secured area divided into a plurality of physical zones, each zone, of the plurality of physical zones, defined by a boundary created on a floor plan by a user;
initiate a test of the security system by initiating a simulated user input identifying an emergency event in one of the plurality of physical zones of the secured area;
responsive to the simulated user input, simulate an emergency response process;
during simulation, display on a graphical user interface of the user interface device a first indicator that identifies a first output regarding instructions provided to occupants within a first physical zone of the plurality of zones;
during the simulation, display on the graphical user interface a second indicator that identifies a second output regarding instructions provided to occupants within a second physical zone of the plurality of zones;
during the simulation, displaying a simulation list of items that can be added to the emergency response process for an input of a cause and effect rule and, during the simulation, selecting an item from the simulation list of items that can be added to the emergency response process and adding the selected item to a future simulated emergency response process; and
overlay and display the first indicator and the second indicator on a floor plan of the secured area displayed on the graphical user interface.

18. The system of claim 17, wherein the programmable processor executes the executable control software to receive input defining and identifying a respective location of each of a plurality of zones in the secured area and to receive input identifying a respective evacuation route from each of the plurality of zones and display each evacuation route on the floor plan of the secured area displayed on the graphical user interface.

* * * * *